(12) United States Patent
Drewery

(10) Patent No.: US 12,191,122 B2
(45) Date of Patent: Jan. 7, 2025

(54) ELECTROSTATIC CHUCK WITH SPATIALLY TUNABLE RF COUPLING TO A WAFER

(71) Applicant: LAM RESEARCH CORPORATION, Fremont, CA (US)

(72) Inventor: John Drewery, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 258 days.

(21) Appl. No.: 17/603,636

(22) PCT Filed: Apr. 14, 2020

(86) PCT No.: PCT/US2020/028120
§ 371 (c)(1),
(2) Date: Oct. 14, 2021

(87) PCT Pub. No.: WO2020/219304
PCT Pub. Date: Oct. 29, 2020

(65) Prior Publication Data
US 2022/0199378 A1 Jun. 23, 2022

Related U.S. Application Data

(60) Provisional application No. 62/836,836, filed on Apr. 22, 2019.

(51) Int. Cl.
*C23C 16/40* (2006.01)
*C23C 16/458* (2006.01)
(Continued)

(52) U.S. Cl.
CPC .... *H01J 37/32724* (2013.01); *C23C 16/4586* (2013.01); *C23C 16/463* (2013.01);
(Continued)

(58) Field of Classification Search
CPC .......... H01J 37/32724; H01J 37/32568; H01J 2237/3321; H01J 2237/3341;
(Continued)

(56) References Cited

U.S. PATENT DOCUMENTS 5,835,334 A 11/1998 McMillin et al.
5,904,776 A 5/1999 Donde et al.
(Continued)

FOREIGN PATENT DOCUMENTS

CN 105632993 A 6/2016
JP H06349938 A 12/1994
(Continued)

OTHER PUBLICATIONS

Definition for "dielectric constant"—https://www.oxfordreference.com/display/10.1093/oi/authority.20110810104744235 (Year: 2024).*
(Continued)

*Primary Examiner* — Rudy Zervigon

(57) ABSTRACT

A substrate support assembly to support a semiconductor substrate in a processing chamber includes a baseplate arranged in the processing chamber, a dielectric layer arranged on the baseplate to support the semiconductor substrate, an electrode disposed in the dielectric layer along a horizontal plane, and a plurality of channels to carry a fluid. The plurality of channels are disposed in the dielectric layer along the horizontal plane on a side of the electrode facing away from the baseplate.

38 Claims, 14 Drawing Sheets

(51) Int. Cl.
*C23C 16/46* (2006.01)
*H01J 37/32* (2006.01)

(52) U.S. Cl.
CPC . *H01J 37/32568* (2013.01); *H01J 2237/3321* (2013.01); *H01J 2237/3341* (2013.01)

(58) Field of Classification Search
CPC ........... H01J 37/32706; H01J 37/32715; H01J 15/00; H01J 37/32091; H01J 37/32082; H01J 37/3244; H01J 37/32623; H01J 37/32009; H01J 37/32532; C23C 16/4586; C23C 16/463; C23C 16/46; C23C 16/5096; C23C 16/507; C23C 16/509; C23C 16/45565; H01L 21/67103; H01L 21/67109; H01L 21/6831; H01L 21/67248; H01L 21/6833; H01L 21/68785; H01L 21/67069; H02N 13/00
USPC ...... 118/723 E, 723 ER, 663, 695, 696, 708; 156/345.43, 345.44, 345.45, 345.46, 156/345.47, 345.24
See application file for complete search history.

(56) References Cited

U.S. PATENT DOCUMENTS

| | | | |
|---|---|---|---|
| 6,170,496 B1 | 1/2001 | Chen et al. | |
| 6,320,736 B1* | 11/2001 | Shamouilian | C23C 16/4586 361/115 |
| 6,367,413 B1 | 4/2002 | Sill et al. | |
| 2004/0084143 A1* | 5/2004 | Ivanov | C23C 18/1678 257/E21.174 |
| 2007/0081294 A1 | 4/2007 | Buchberger et al. | |
| 2007/0081296 A1* | 4/2007 | Brillhart | H01L 21/6831 361/234 |
| 2007/0258186 A1* | 11/2007 | Matyushkin | H01L 21/6875 361/234 |
| 2009/0014323 A1 | 1/2009 | Yendler et al. | |
| 2009/0182218 A1 | 7/2009 | Lee | |
| 2010/0025372 A1* | 2/2010 | Tsujimoto | H01J 37/32091 156/345.28 |
| 2010/0303680 A1 | 12/2010 | Buchberger, Jr. et al. | |
| 2011/0024047 A1* | 2/2011 | Nguyen | C23C 14/564 118/723 R |
| 2012/0024819 A1 | 2/2012 | Suemitsu | |
| 2012/0196242 A1* | 8/2012 | Volfovski | H01L 21/67109 432/92 |
| 2015/0176928 A1* | 6/2015 | Tabuchi | G05D 23/1951 165/96 |
| 2016/0276198 A1 | 9/2016 | Anada et al. | |
| 2017/0352568 A1* | 12/2017 | Cho | H01L 21/6831 |
| 2018/0053674 A1 | 2/2018 | Lee et al. | |
| 2018/0122680 A1 | 5/2018 | Yang | |
| 2018/0182647 A1 | 6/2018 | Noh et al. | |
| 2018/0190475 A1 | 7/2018 | Shin | |
| 2018/0350610 A1 | 12/2018 | Lingampalli et al. | |
| 2018/0366304 A1 | 12/2018 | Shim et al. | |
| 2023/0019439 A1* | 1/2023 | Kuno | H01L 21/68757 |
| 2023/0178344 A1* | 6/2023 | Drewery | H01J 37/32724 156/345.51 |

FOREIGN PATENT DOCUMENTS

| | | |
|---|---|---|
| JP | H10050813 A | 2/1998 |
| JP | 2001110883 A | 4/2001 |
| JP | 2003318161 A | 11/2003 |
| JP | 2012033385 A | 2/2012 |
| JP | 2014021828 A | 2/2014 |
| JP | 2014232884 A | 12/2014 |
| KR | 20070081296 A | 8/2007 |
| KR | 20180131423 A | 12/2018 |
| KR | 20190013362 A | 2/2019 |
| WO | WO-9939120 A1 | 8/1999 |
| WO | WO-2017213714 A1 | 12/2017 |

OTHER PUBLICATIONS

International Search Report and Written Opinion of the ISA issued in PCT/US2020/028120, mailed Jul. 29, 2020; ISA/KR.
Taiwanese Office Action for Taiwan Application No. 109113287 dated Feb. 29, 2024.
Chinese Office Action and Search Report for Chinese Application No. 202080030602.5 dated Jun. 29, 2024.
Japanese Office Action for Japan Application No. 2021-562782 dated Jun. 4, 2024.
Korean Office Action for Korean Application No. 10-2021-7037894 mailed Oct. 18, 2024.

* cited by examiner

ELECTROSTATIC CHUCK WITH SPATIALLY TUNABLE RF COUPLING TO A WAFER

CROSS-REFERENCE TO RELATED APPLICATIONS

This application is a U.S. National Phase Application under 35 U.S.C. 371 of International Application No. PCT/US2020/028120, filed on Apr. 14, 2020, which claims the benefit of U.S. Provisional Application No. 62/836,836, filed on Apr. 22, 2019. The entire disclosures of the applications referenced above are incorporated herein by reference.

FIELD

The present disclosure relates generally to substrate processing systems and more particularly to an electrostatic chuck with spatially tunable RF coupling to a wafer.

BACKGROUND

The background description provided here is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

A substrate processing system typically includes a plurality of processing chambers (also called process modules) to perform deposition, etching, and other treatments of substrates such as semiconductor wafers. Examples of processes that may be performed on a substrate include, but are not limited to, a plasma enhanced chemical vapor deposition (PECVD) process, a chemically enhanced plasma vapor deposition (CEPVD) process, and a sputtering physical vapor deposition (PVD) process. Additional examples of processes that may be performed on a substrate include, but are not limited to, etching (e.g., chemical etching, plasma etching, reactive ion etching, etc.) and cleaning processes.

During processing, a substrate is arranged on a substrate support such as a pedestal, an electrostatic chuck (ESC), and so on in a processing chamber of the substrate processing system. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. A computer-controlled robot typically transfers substrates from one processing chamber to another in a sequence in which the substrates are to be processed.

SUMMARY

A substrate support assembly to support a semiconductor substrate in a processing chamber comprises a baseplate arranged in the processing chamber, a dielectric layer arranged on the baseplate to support the semiconductor substrate, an electrode disposed in the dielectric layer along a horizontal plane, and a plurality of channels to carry a fluid. The plurality of channels are disposed in the dielectric layer along the horizontal plane on a side of the electrode facing away from the baseplate.

In other features, a system comprises the substrate support assembly, a power supply to supply power to the electrode during processing of the semiconductor substrate in the processing chamber, and a source of the fluid to supply the fluid to fill the plurality of channels prior to processing the semiconductor substrate.

In other features, a system comprises the substrate support assembly; a plurality of cooling channels disposed in the baseplate; a power supply to supply power to the electrode during processing of the semiconductor substrate in the processing chamber; a source of a coolant to supply the coolant to the cooling channels during the processing of the semiconductor substrate; a plurality of valves in fluid communication with the source, the cooling channels, and the plurality of channels; and a controller to control the plurality of valves to supply the coolant from the source to the cooling channels, and to supply the coolant as the fluid to fill the plurality of channels to a first level prior to performing a first process on the semiconductor substrate.

In other features, the controller is further configured to drain the coolant from the plurality of channels to a second level after performing the first process and prior to performing a second process on the semiconductor substrate.

In other features, the first level indicates that the plurality of channels is completely filled with the coolant, and the second level indicates that the plurality of channels is completely empty.

In other features, a system comprises the substrate support assembly, a power supply to supply power to the electrode during processing of the semiconductor substrate in the processing chamber, a source to supply the fluid, a plurality of valves in fluid communication with the source and the plurality of channels, and a controller to control the plurality of valves to fill the plurality of channels with the fluid to a first level prior to performing a first process on the semiconductor substrate.

In other features, the controller is further configured to drain the fluid from the plurality of channels to a second level after performing the first process and prior to performing a second process on the semiconductor substrate.

In other features, the first level indicates that the plurality of channels is completely filled with the fluid, and the second level indicates that the plurality of channels is completely empty.

In other features, a system comprises the substrate support assembly, a power supply to supply power to the electrode during processing of the semiconductor substrate in the processing chamber, a source to supply the fluid, a heater associated with the source, and a controller to supply power to the heater to fill the plurality of channels with the fluid to a first level prior to performing a first process on the semiconductor substrate.

In other features, the controller is further configured to alter the power supplied to the heater to withdraw the fluid from the plurality of channels to a second level after performing the first process and prior to performing a second process on the semiconductor substrate.

In other features, the first level indicates that the plurality of channels is completely filled with the fluid, and the second level indicates that the plurality of channels is completely empty.

In other features, a system comprises the substrate support assembly, a power supply to supply power to the electrode during processing of the semiconductor substrate in the processing chamber, a first source of the fluid, a second source of a second fluid, a plurality of valves in fluid communication with the first and second sources and the plurality of channels, and a controller to control the plurality of valves to fill the plurality of channels with the fluid to a first level prior to performing a first process on the semiconductor substrate, to drain the fluid from the plurality of channels after performing the first process, and to fill the plurality of channels with the second fluid to a second level prior to performing a second process on the semiconductor substrate.

In another feature, the first level is equal to the second level.

In other features, the first level indicates that the plurality of channels is completely filled with the fluid, and the second level indicates that the plurality of channels is completely filled with the second fluid; the first level indicates that the plurality of channels is completely filled with the fluid, and the second level indicates that the plurality of channels is partially filled with the second fluid; the first level indicates that the plurality of channels is partially filled with the fluid, and the second level indicates that the plurality of channels is completely filled with the second fluid; or the first level indicates that the plurality of channels is partially filled with the fluid, and the second level indicates that the plurality of channels is partially filled with the second fluid.

In other features, a system comprises the substrate support assembly; a second plurality of channels disposed in the dielectric layer along the horizontal plane on the side of the electrode facing away from the baseplate; a power supply to supply power to the electrode during processing of the semiconductor substrate in the processing chamber; a first source of the fluid; a second source of a second fluid; a plurality of valves in fluid communication with the first and second sources, the plurality of channels, and the second plurality of channels; and a controller to control the plurality of valves to fill the plurality of channels with the fluid to a first level prior to performing a process on the semiconductor substrate, and to fill the second plurality of channels with the second fluid to a second level prior to performing the process on the semiconductor substrate.

In another feature, the first level is equal to the second level.

In other features, the first level indicates that the plurality of channels is completely filled with the fluid, and the second level indicates that the second plurality of channels is completely filled with the second fluid; the first level indicates that the plurality of channels is completely filled with the fluid, and the second level indicates that the second plurality of channels is partially filled with the second fluid; the first level indicates that the plurality of channels is partially filled with the fluid, and the second level indicates that the second plurality of channels is completely filled with the second fluid; or the first level indicates that the plurality of channels is partially filled with the fluid, and the second level indicates that the second plurality of channels is partially filled with the second fluid.

In other features, a system comprises the substrate support assembly; a second plurality of channels disposed in the dielectric layer along the horizontal plane on the side of the electrode facing away from the baseplate; a power supply to supply power to the electrode during processing of the semiconductor substrate in the processing chamber; a first source of the fluid; a second source of a second fluid; a plurality of valves in fluid communication with the first and second sources, the plurality of channels, and the second plurality of channels; and a controller to control the plurality of valves to fill the plurality of channels with the fluid to a first level prior to performing a first process on the semiconductor substrate while the second plurality of channels is empty, to drain the fluid from the plurality of channels after performing the first process; and to fill the second plurality of channels with the second fluid to a second level prior to performing a second process on the semiconductor substrate.

In another feature, the first level is equal to the second level.

In other features, the first level indicates that the plurality of channels is completely filled with the fluid, and the second level indicates that the second plurality of channels is completely filled with the second fluid; the first level indicates that the plurality of channels is completely filled with the fluid, and the second level indicates that the second plurality of channels is partially filled with the second fluid; the first level indicates that the plurality of channels is partially filled with the fluid, and the second level indicates that the second plurality of channels is completely filled with the second fluid; or the first level indicates that the plurality of channels is partially filled with the fluid, and the second level indicates that the second plurality of channels is partially filled with the second fluid.

In another feature, the plurality of channels is arranged in an annular region of the dielectric layer.

In other features, the substrate support assembly further comprises a second plurality of channels disposed in the dielectric layer along the horizontal plane on the side of the electrode facing away from the baseplate. The plurality of channels is arranged in a first annular region of the dielectric layer. The second plurality of channels is arranged in a second annular region of the dielectric layer. The first and second annular regions respectively have first and second areas.

In another feature, the plurality of channels is arranged in a pie-shaped region of the dielectric layer.

In other features, the substrate support assembly 1 further comprises a second plurality of channels disposed in the dielectric layer along the horizontal plane on the side of the electrode facing away from the baseplate. The plurality of channels is arranged in a first pie-shaped region of the dielectric layer. The second plurality of channels is arranged in a second pie-shaped region of the dielectric layer. The first and second pie-shaped regions respectively have first and second areas.

In another feature, the plurality of channels is serpentine in shape.

In another feature, the plurality of channels is formed by a porous material.

In another feature, the plurality of channels includes a plurality of serpentine portions connected in series.

In other features, the plurality of channels is arranged in a manifold in the dielectric layer and includes a plurality of serpentine portions connected in parallel in the manifold.

In other features, the plurality of channels is formed by arranging two annular grooves in the dielectric layer and arranging a plurality grooves radially connecting the two annular grooves, and each groove in the plurality grooves is smaller than the two annular grooves.

In other features, a system comprises the substrate support assembly, a radio frequency power supply to supply radio frequency power to the electrode during processing of the semiconductor substrate in the processing chamber, a direct current power supply to supply direct current power to the electrode during the processing of the semiconductor substrate, and a source of the fluid to supply the fluid to fill the plurality of channels prior to the processing of the semiconductor substrate.

In other features, a system comprises the substrate support assembly, a second electrode disposed in the dielectric layer along the horizontal plane on a side of the plurality of channels facing away from the electrode, a radio frequency power supply to supply radio frequency power to the electrode during processing of the semiconductor substrate in the processing chamber, a direct current power supply to supply direct current power to the second electrode during the processing of the semiconductor substrate, and a source of the fluid to supply the fluid to fill the plurality of channels prior to the processing of the semiconductor substrate.

In other features, the second electrode includes a first annular segment and a second annular segment, and the plurality of channels is arranged in an annular region of the dielectric layer beneath the first annular segment.

In other features, the second electrode includes a first annular segment and a second annular segment, the plurality of channels is arranged in an annular region of the dielectric layer beneath the first annular segment, and a portion of the dielectric layer separates the second electrode from the plurality of channels.

In other features, the second electrode includes an outer electrode and an inner electrode; the outer electrode includes a first annular segment and a second annular segment; the plurality of channels is arranged in an annular region of the dielectric layer beneath the first annular segment; a portion of the dielectric layer separates the second electrode from the plurality of channels; and the direct current power supply supplies the direct current power to the first annular segment via a first resistor, to the second annular segment via a second resistor, and to the inner electrode via a third resistor.

In other features, the fluid includes a liquid, a gas, air, a fluorinated liquid, or a liquid metal selected from a group consisting of mercury and an alloy containing Bismuth, Antimony, Gallium, and/or Indium.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In some etch processes, an etch rate of a semiconductor wafer (hereinafter a wafer) needs to be tunable from center to edge of the wafer. For the etch rate to be tunable, RF power delivered to the wafer needs to be tunable from center to edge of the wafer. Some applications use dual-fed electrostatic chucks, where splitters are used to focus RF power to separate concentric zones of the wafer. This approach, however, has several disadvantages such as cost, complexity of the RF delivery system, and so on.

Instead, the systems and methods of the present disclosure deliver tunable RF power to a wafer using a single RF feed. Specifically, flow of RF current to the wafer depends on the coupling between an RF electrode and the wafer. The RF current is proportional to an effective dielectric constant of the material between the RF electrode and the wafer. Accordingly, by varying the permittivity of the material between the RF electrode and the wafer, the RF current to the wafer can be varied.

According to the present disclosure, the effective dielectric constant of the material between the RF electrode and the wafer can be varied by providing micro-channels in the material between the RF electrode and the wafer. The micro-channels can be filled with air or a medium with higher permittivity than air. For example, a coolant supplied to an electrostatic chuck (ESC) can be used to fill the micro-channels. However, the coolant typically includes fluorinated liquids, which have relatively low dielectric constants. Accordingly, other materials including liquid metals can be used to fill the micro-channels.

These and other features of the present disclosure including various configurations and layouts of the micro-channels and various methods of filling and emptying the micro-channels are described below in detail. The teachings of the present disclosure are not limited to etch processes but are also applicable to deposition processes such as when depositing dielectric layers on wafers, for example.

Figure 6:
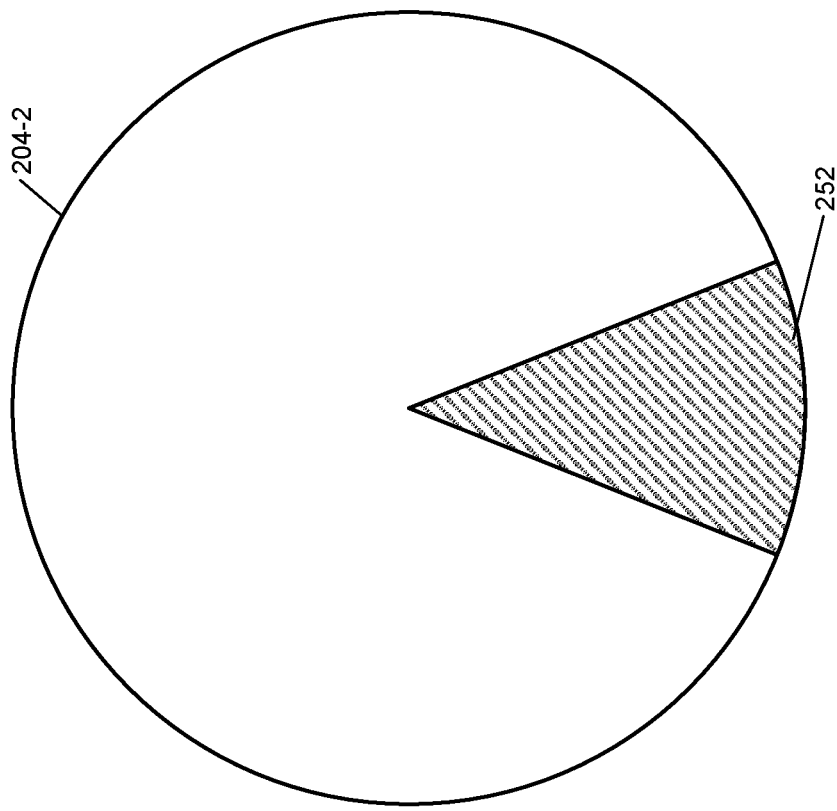
FIGS. 5 and 6 show examples of shapes in which the micro-channels can be arranged in the ESC.

The present disclosure is organized as follows. Initially, examples of processing chambers for processing wafers are shown and described with reference to FIGS. 1A and 1B. A simplified overview of an ESC without and with micro-channels is shown and described with reference to FIGS. 2-4. Some examples of shapes in which the micro-channels can be arranged in the ESC are shown in FIGS. 5 and 6. Various examples of apparatuses for filling and emptying the micro-channels are shown and described with reference to FIGS. 7-10. Various configurations and layouts of the micro-channels are shown and described with reference to FIGS. 11-15. Various examples of configurations of the ESC comprising the micro-channels are shown and described with reference to FIGS. 16-19. An example of a system for supplying power to a clamping electrode of the ESC comprising the micro-channels is shown and described with reference to FIG. 20.

Figure 1A:
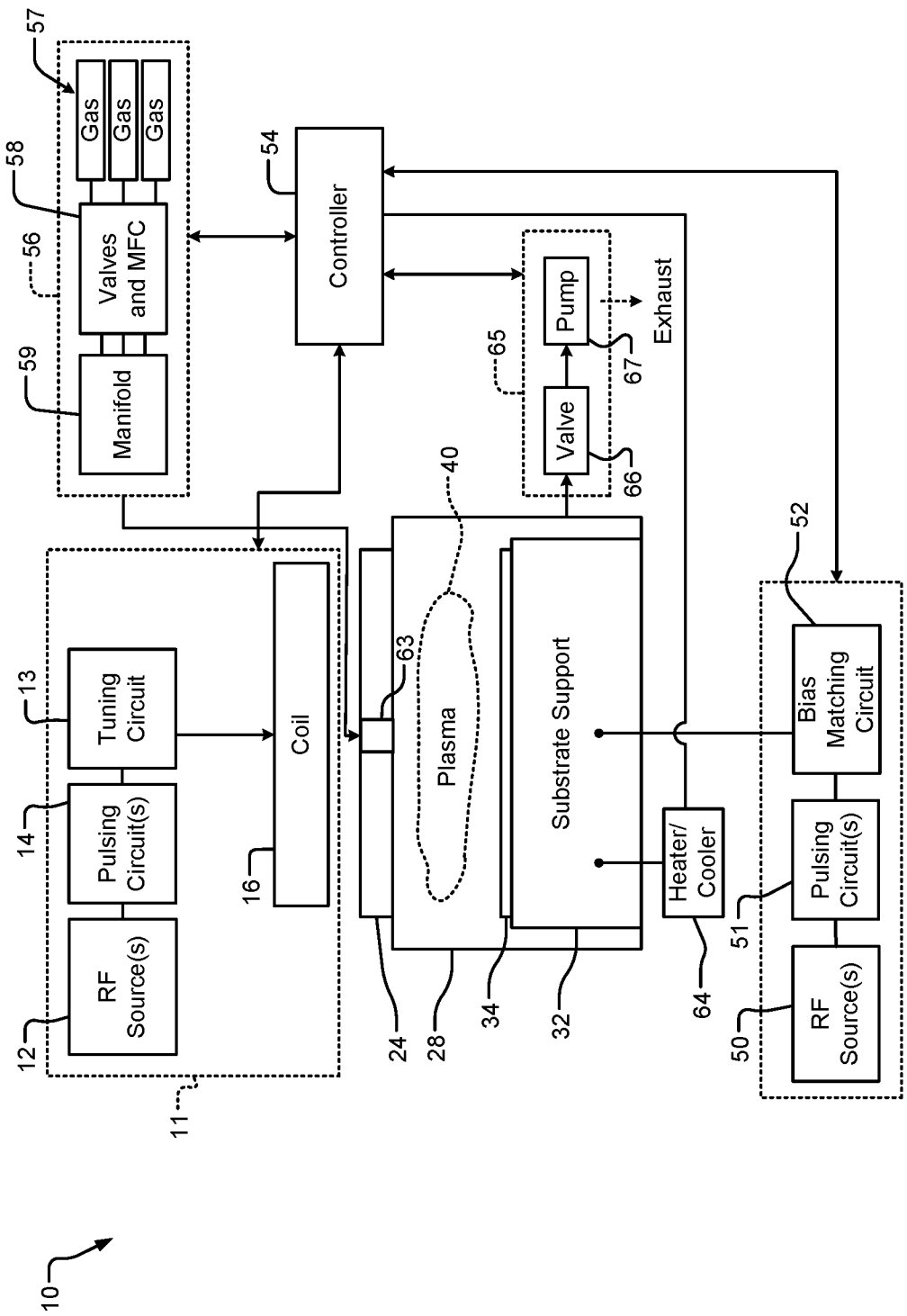
FIG. 1 is a functional block diagram of a substrate processing system comprising a processing chamber that uses inductively coupled plasma to etch substrates such as semiconductor wafers.
FIG. 1B is a functional block diagram of a substrate processing system comprising a processing chamber.

FIG. 1A shows an example of a substrate processing system 10 according to the present disclosure. The substrate processing system 10 includes a coil driving circuit 11. In some examples, the coil driving circuit 11 includes an RF source 12, a pulsing circuit 14, and a tuning circuit (i.e., matching circuit) 13. The pulsing circuit 14 controls a transformer coupled plasma (TCP) envelope of an RF signal generated by the RF source 12 and varies a duty cycle of TCP envelope between 1% and 99% during operation. As can be appreciated, the pulsing circuit 14 and the RF source 12 can be combined or separate.

The tuning circuit 13 may be directly connected to an inductive coil 16. While the substrate processing system 10 uses a single coil, some substrate processing systems may use a plurality of coils (e.g., inner and outer coils). The tuning circuit 13 tunes an output of the RF source 12 to a desired frequency and/or a desired phase, and matches an impedance of the coil 16.

A dielectric window 24 is arranged along a top side of a processing chamber 28. The processing chamber 28 further comprises a substrate support (or pedestal) 32 to support a substrate 34. The substrate support 32 may include an electrostatic chuck (ESC), or a mechanical chuck or other type of chuck. Process gas is supplied to the processing chamber 28 and plasma 40 is generated inside of the processing chamber 28. The plasma 40 etches an exposed surface of the substrate 34. An RF source 50, a pulsing circuit 51, and a bias matching circuit 52 may be used to bias the substrate support 32 during operation to control ion energy.

A gas delivery system 56 may be used to supply a process gas mixture to the processing chamber 28. The gas delivery system 56 may include process and inert gas sources 57, a gas metering system 58 such as valves and mass flow controllers, and a manifold 59. A gas injector 63 may be arranged at a center of the dielectric window 24 and is used to inject gas mixtures from the gas delivery system 56 into the processing chamber 28. Additionally or alternatively, the gas mixtures may be injected from the side of the processing chamber 28.

A heater/cooler 64 may be used to heat/cool the substrate support 32 to a predetermined temperature. An exhaust system 65 includes a valve 66 and pump 67 to control pressure in the processing chamber and/or to remove reactants from the processing chamber 28 by purging or evacuation.

A controller 54 may be used to control the etching process. The controller 54 monitors system parameters and controls delivery of the gas mixture; striking, maintaining, and extinguishing the plasma; removal of reactants; supply of cooling gas; and so on. Additionally, as described below, the controller 54 may control various aspects of the coil driving circuit 10, the RF source 50, and the bias matching circuit 52, and so on.

Figure 1B:
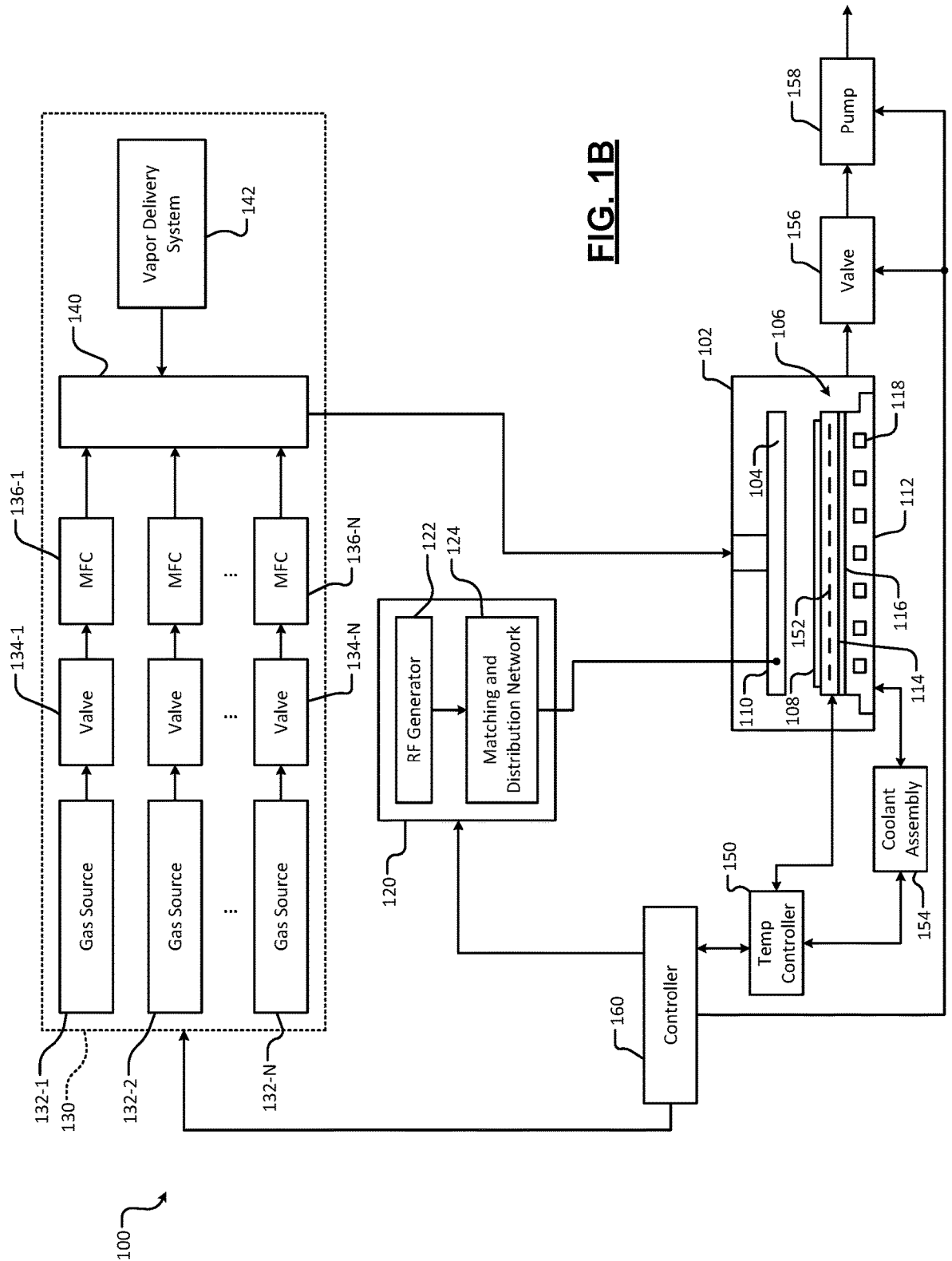

FIG. 1B shows an example of a substrate processing system 100 comprising a processing chamber 102. While the example is described in the context of plasma enhanced chemical vapor deposition (PECVD), the teachings of the present disclosure can be applied to other types of substrate processing such as atomic layer deposition (ALD), plasma enhanced ALD (PEALD), CVD, or also other processing including etching processes. The system 100 comprises the processing chamber 102 that encloses other components of the system 100 and contains an RF plasma (if used). The processing chamber 102 comprises an upper electrode 104 and an electrostatic chuck (ESC) 106 or other substrate support. During operation, a substrate 108 is arranged on the ESC 106.

For example, the upper electrode 104 may include a gas distribution device 110 such as a showerhead that introduces and distributes process gases. The gas distribution device 110 may include a stem portion including one end connected to a top surface of the processing chamber 102. A base portion of the showerhead is generally cylindrical and extends radially outwardly from an opposite end of the stem portion at a location that is spaced from the top surface of the processing chamber 102. A substrate-facing surface or faceplate of the base portion of the showerhead includes a plurality of holes through which vaporized precursor, process gas, or purge gas flows. Alternately, the upper electrode 104 may include a conducting plate, and the process gases may be introduced in another manner.

The ESC 106 comprises a baseplate 112 that acts as a lower electrode. The baseplate 112 supports a heating plate 114, which may correspond to a ceramic multi-zone heating plate. A thermal resistance layer 116 may be arranged between the heating plate 114 and the baseplate 112. The baseplate 112 may include one or more channels 118 for flowing coolant through the baseplate 112.

If plasma is used, an RF generating system 120 generates and outputs an RF voltage to one of the upper electrode 104 and the lower electrode (e.g., the baseplate 112 of the ESC 106). The other one of the upper electrode 104 and the baseplate 112 may be DC grounded, AC grounded, or floating. For example only, the RF generating system 120 may include an RF generator 122 that generates RF power that is fed by a matching and distribution network 124 to the upper electrode 104 or the baseplate 112. In other examples, the plasma may be generated inductively or remotely.

A gas delivery system 130 includes one or more gas sources 132-1, 132-2, . . . , and 132-N (collectively gas sources 132), where N is an integer greater than zero. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. A vapor delivery system 142 supplies vaporized precursor to the manifold 140 or another manifold (not shown) that is connected to the processing chamber 102. An output of the manifold 140 is fed to the processing chamber 102.

A temperature controller 150 may be connected to a plurality of thermal control elements (TCEs) 152 arranged in the heating plate 114. The temperature controller 150 may be used to control the plurality of TCEs 152 to control a temperature of the ESC 106 and the substrate 108. The temperature controller 150 may communicate with a coolant assembly 154 to control coolant flow through the channels 118. For example, the coolant assembly 154 may include a coolant pump, a reservoir, and one or more temperature sensors (not shown). The temperature controller 150 operates the coolant assembly 154 to selectively flow the coolant through the channels 118 to cool the ESC 106. A valve 156 and pump 158 may be used to evacuate reactants from the processing chamber 102. A system controller 160 controls the components of the system 100.

Figures 2, 3:
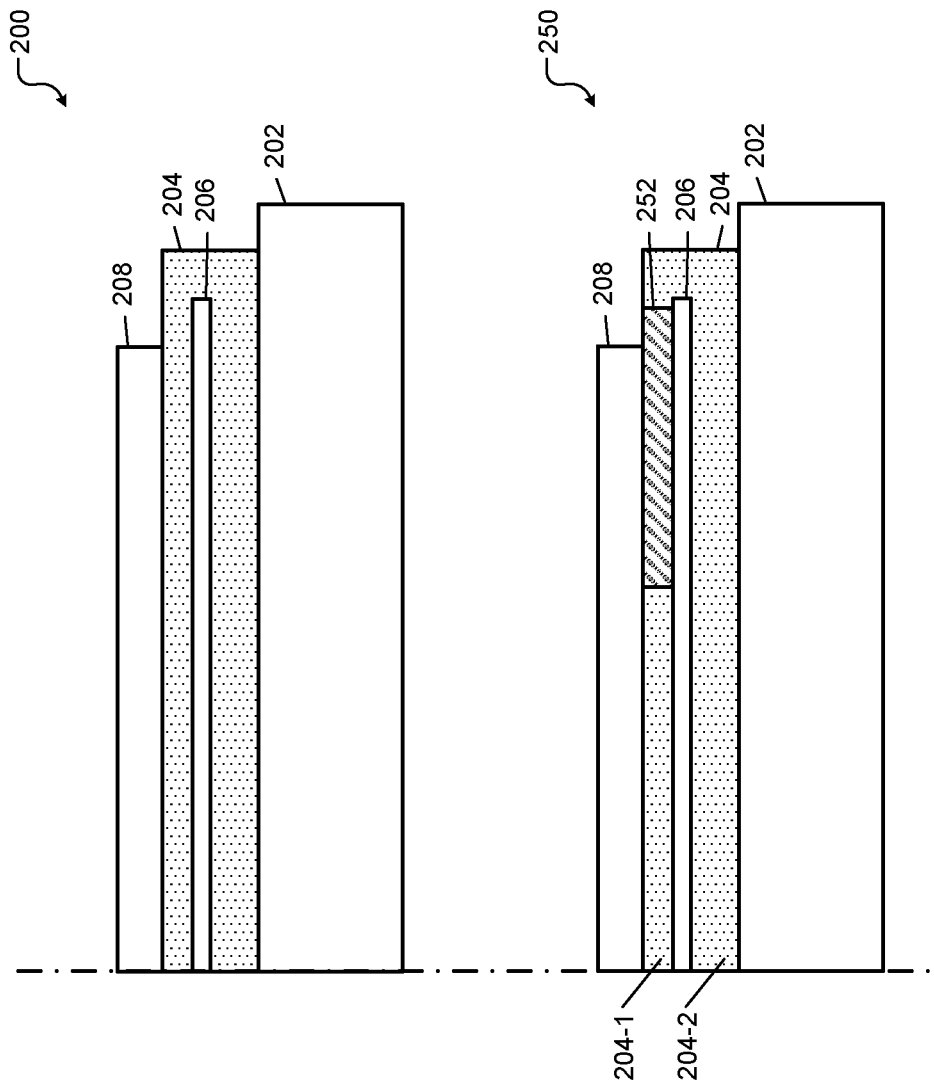
FIG. 2 shows a simplified overview of an electrostatic chuck (ESC) used in a processing chamber of the substrate processing system of FIG. 1.
FIGS. 3 and 4 show a simplified overview of an ESC comprising micro-channels disposed in a ceramic layer of the ESC.
Figure 4:
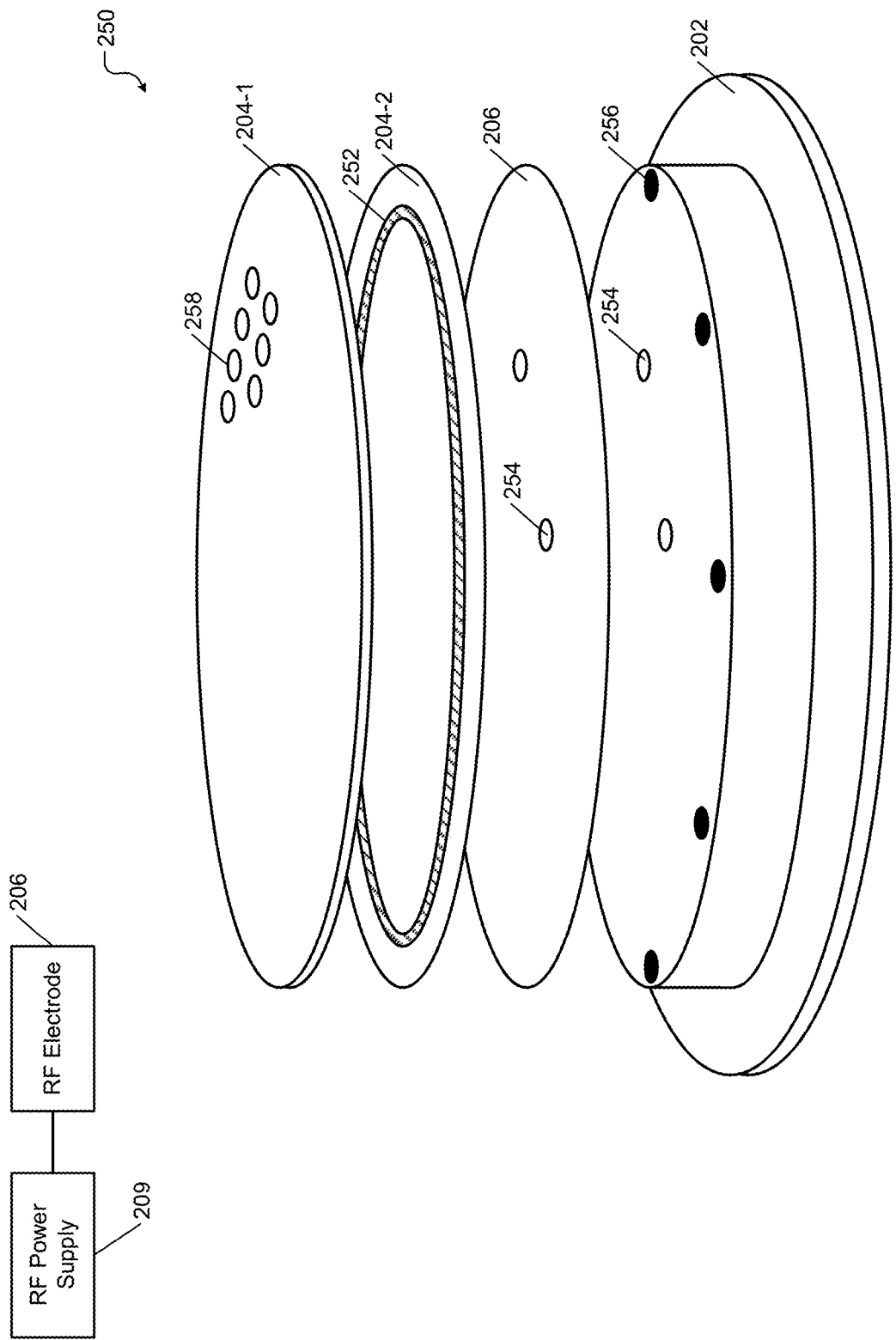
Figure 5:
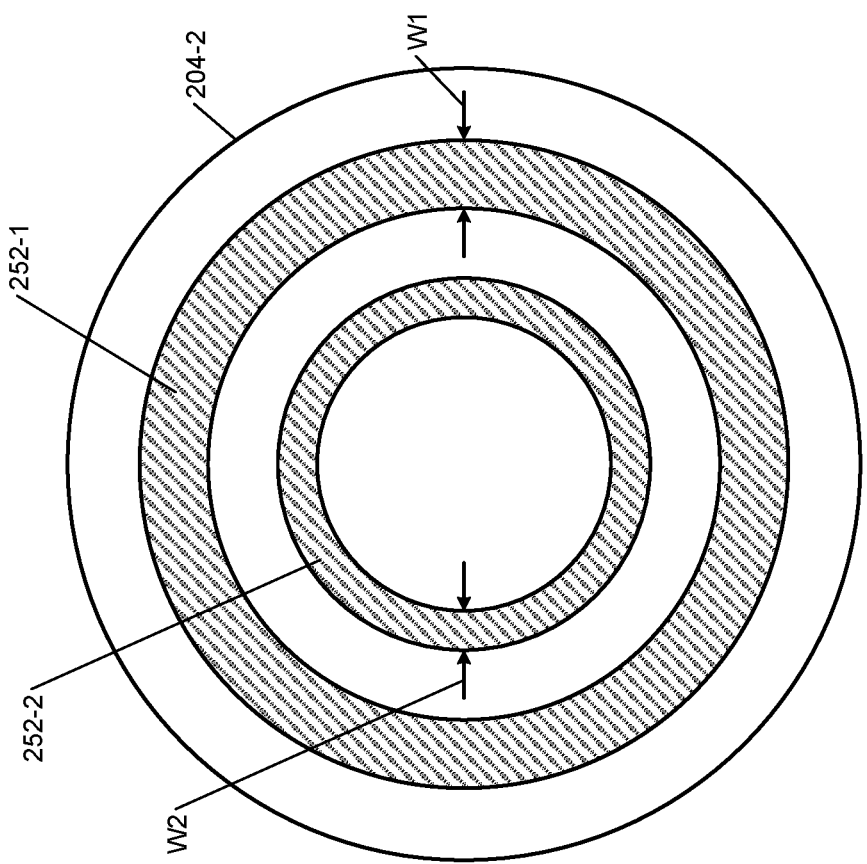

FIGS. 2-4 show a simplified overview of an ESC and the micro-channels. FIG. 2 shows a simplified cross-section of an ESC without the micro-channels, such as the substrate support 32 shown in FIG. 1A and the ESC 106 shown in FIG. 1B. Hereinafter, all references to the ESC 106 should be understood as also referencing the substrate support 32. FIG. 3 shows a simplified cross-section of an ESC comprising the micro-channels according to the present disclosure. FIG. 4 shows a schematic representation of the ESC comprising the micro-channels.

In FIGS. 2 and 3, a vertical line on the left hand side denotes a line passing through the center of the ESC. Accordingly, the cross-sections in FIGS. 2 and 3 show only the right hand side of the cross-section of the ESC. The left hand side of the cross-section of the ESC is a mirror image of the right hand side of the cross-section of the ESC. Further, for simplicity of illustration and to emphasize the location where the micro-channels are disposed in the ESC, numerous structures of the ESC are omitted.

In FIG. 2, an ESC 200 (similar to elements 32 and 106 respectively shown in FIGS. 1A and 1B) comprises a baseplate 202 (e.g., the baseplate 112 shown in FIG. 1B), a ceramic layer (also called a dielectric layer) 204 disposed on top of the baseplate 202, and an RF electrode 206 disposed within the ceramic layer 204. A wafer 208 may be arranged on the ceramic layer 204 during processing. RF power is supplied from an RF power supply 209 to the RF electrode 206 while performing an etching process on the wafer 208 or while depositing a dielectric layer on the wafer 208, for example. The baseplate 202 is the metallic body of the ESC 200 and includes other structures of the ESC 106 such as the cooling channels 118, the heating plate 114 (generally located between the metallic body and the ceramic layer, or includes resistive traces embedded in the ceramic layer), and the thermal resistance layer 116 shown in FIG. 1B. In other words, element 202 comprises elements 114, 116, and 118 of the ESC 106.

Throughout the present disclosure, a portion of the ceramic layer 204 above the RF electrode 206 and below the wafer 208 (i.e., between the RF electrode 206 and the wafer 208) is referred to as an upper ceramic layer (or an upper dielectric layer) 204-1. A portion of the ceramic layer 204 below the RF electrode 206 and above the baseplate 202 (i.e., between the RF electrode 206 and the baseplate 202) is referred to as a lower ceramic layer (or a lower dielectric layer) 204-2.

In FIG. 3, an ESC 250 comprising a region 252 of variable effective permittivity in the upper ceramic layer 204-1 is shown. The variable permittivity is provided by inserting microfluidic channels (called micro-channels throughout the present disclosure) or porous media in the region 252 within the upper ceramic layer 204-1. Permittivity is varied by allowing air or a fluid to fill the micro-channels as explained below in detail. The region 252 comprising the micro-channels may also be referred to as the micro-channel region 252 or simply as the micro-channels 252 throughout the present disclosure. The micro-channels 252 are disposed in the upper ceramic layer 204-1 directly beneath the wafer 208 and directly above the RF electrode 206.

In FIG. 4, a schematic representation of the ESC 250 of FIG. 3 comprising the micro-channel region 252 is shown. Additionally, channels 254 for filling and emptying the micro-channels are partially shown. Further, RF transfer structures 256 and minimum contact features 258 are also partially shown.

FIG. 4 shows only one example of the micro-channels 252. For example, FIG. 4 shows that a layout of the micro-channels 252 is annular. However, the present disclosure is not so limited. In some applications, a plurality of such annular micro-channels 252-1, 252-2 may be disposed in the ceramic layer 204 as shown in FIG. 5. Further, the plurality of such annular micro-channels 252-1, 252-2 may be of different widths W1, W2 as shown or may be of the same width (i.e., W1 may be equal to W2).

Alternatively, the micro-channels 252 may be pie-shaped as shown in FIG. 6. While only one pie shape is shown, depending on the application, the micro-channels may be arranged in a plurality of pie shapes. Further, the length of the arc (i.e., size of area) of the pie shapes may be the same or may be different. Furthermore, the pie shapes may extend from the center all the way to the edge of the circumference or may extend from the center to less than all the way to the edge of the circumference.

The micro-channels 252 can be arranged in the ceramic layer 204 in many other geometric shapes such as circles, ovals, squares, rectangles, hexagons, and so on. Furthermore, a combination of any of these arrangements and shapes is contemplated and is within the scope of the present disclosure. Further, in some applications, the micro-channels 252 may be disposed in the ceramic layer 204 to cover the entire area beneath the wafer 208. These shapes and arrangements may include any configuration of the micro-channels 252 shown and described with reference to FIGS. 11-15 and may be disposed in an ESC in any manner shown and described with reference to FIGS. 16-19.

In some applications, different fluids can be filled in the two separate micro-channels (e.g., in the two different annular regions 252-1, 252-2 shown in FIG. 5) to provide two different etch rates. In some applications, where the micro-channels 252 are arranged in a plurality of different shapes, depending on the application, one set of shapes may be filled with one fluid while another set of shapes may be filled with another fluid to vary etch rates across different regions of the wafer. Various apparatuses and methods for filling and emptying the micro-channels 252, which are described below with reference to FIGS. 7-10, may be used.

During processing of a wafer, if a higher etch (or deposition) rate is desired in an area of the wafer, the relevant process step is performed after filling the micro-channels 252 under the area with a suitable fluid. Subsequently, if a lower etch rate is desired in the area of the wafer, the fluid under the area is removed from the micro-channels 252, and a next process step is performed.

Alternatively, two different fluids may be used to alternately fill the same micro-channels 252 to provide two different etch rates in the area of the wafer. For example, before performing a first process step, the micro-channels 252 can be filled with a first fluid to provide a first etch rate during the first process step. Subsequently, if a second, different etch rate (higher or lower that the first etch rate) is desired, the first fluid is removed from the micro-channels 252, and the micro-channels 252 are filled with a second fluid (instead of air) to provide the second etch rate during a second process step. Using two different fluids instead of using a fluid and air, which is the other alternative, provides improved thermal conductivity while also changing the dielectric constant of the material beneath the area of the wafer. Various apparatuses and methods for filling and emptying the micro-channels, which are described below with reference to FIGS. 7-10, may be used.

Furthermore, as will be explained below in detail, in some instances, two different etch rates may be desired in two different sections of the wafer. Accordingly, two separate sets of micro-channels 252 can be disposed under the two different sections of the wafer (e.g., using any of the shapes and arrangements mentioned above with reference to FIGS. 5 and 6). Two different fluids can be filled in the two separate micro-channels 252 to provide two different etch rates. The two different etch rates in two different sections of the wafer may be achieved during the same process step or during two different process steps. The filling and emptying of the two sets of micro-channels can be coordinated accordingly. Again, various apparatuses and methods for filling and emptying the micro-channels 252, which are described below with reference to FIGS. 7-10, may be used.

While the apparatuses and methods of FIGS. 7-10 show only one fluid used to fill the micro-channels 252, it is understood that two different fluids can be used to fill two separate micro-channels 252 using similar additional apparatus. Further, as mentioned before, the fluids used to fill the micro-channels 252 can include liquid metals. Examples of liquid metals include mercury and alloys containing low-melting bismuth/antimony/gallium/indium (e.g., gallium-indium eutectic alloy with 74.5% wt % Ga has a melting point of 15.7 degrees Celsius).

In general, the micro-channels 252 may be disposed about 1-2 millimeters beneath the wafer 208. That is, there may be about 1-2 millimeters of the ceramic material (of the upper ceramic payer 204-1) between the micro-channels 252 and the wafer 208. Further, as will be explained below in detail with reference to FIGS. 13-19, which show various layouts and configurations of the micro-channels 252, when designing the micro-channels 252 for specific applications, the pitch of the micro-channels 252 can be decreased as the distance between the micro-channels 252 and the wafer 208 is decreased.

That is, the micro-channels 252 can be narrower and laid closer together in the upper ceramic payer 204-1 as the micro-channels 252 are disposed closer to the wafer 208. Conversely, the micro-channels 252 can be broader and laid farther apart from each other in the upper ceramic payer 204-1 as the micro-channels 252 are disposed farther from the wafer 208. Furthermore, depending on the specific application, the width of the micro-channels 252 may be different towards the circumference of the ceramic layer 204 than towards the center of the ceramic layer 204. Generally, the width of the micro-channels 252 may be greater than the height of the micro-channels 252.

Detailed examples of the micro-channels 252, including sample layouts and examples of dimensions of the micro-channels 252, are shown and described with reference to FIGS. 11-15. Before that, various examples of apparatuses and methods for filling and emptying the micro-channels 252 are shown and described below with reference to FIGS. 7-10. In FIGS. 7-10, an oversimplified schematic of the ESC 250 is shown. Numerous structural details associated with the ESC 250 are omitted so as to focus on the apparatuses and methods for filling and emptying the micro-channels 252.

Figure 7:
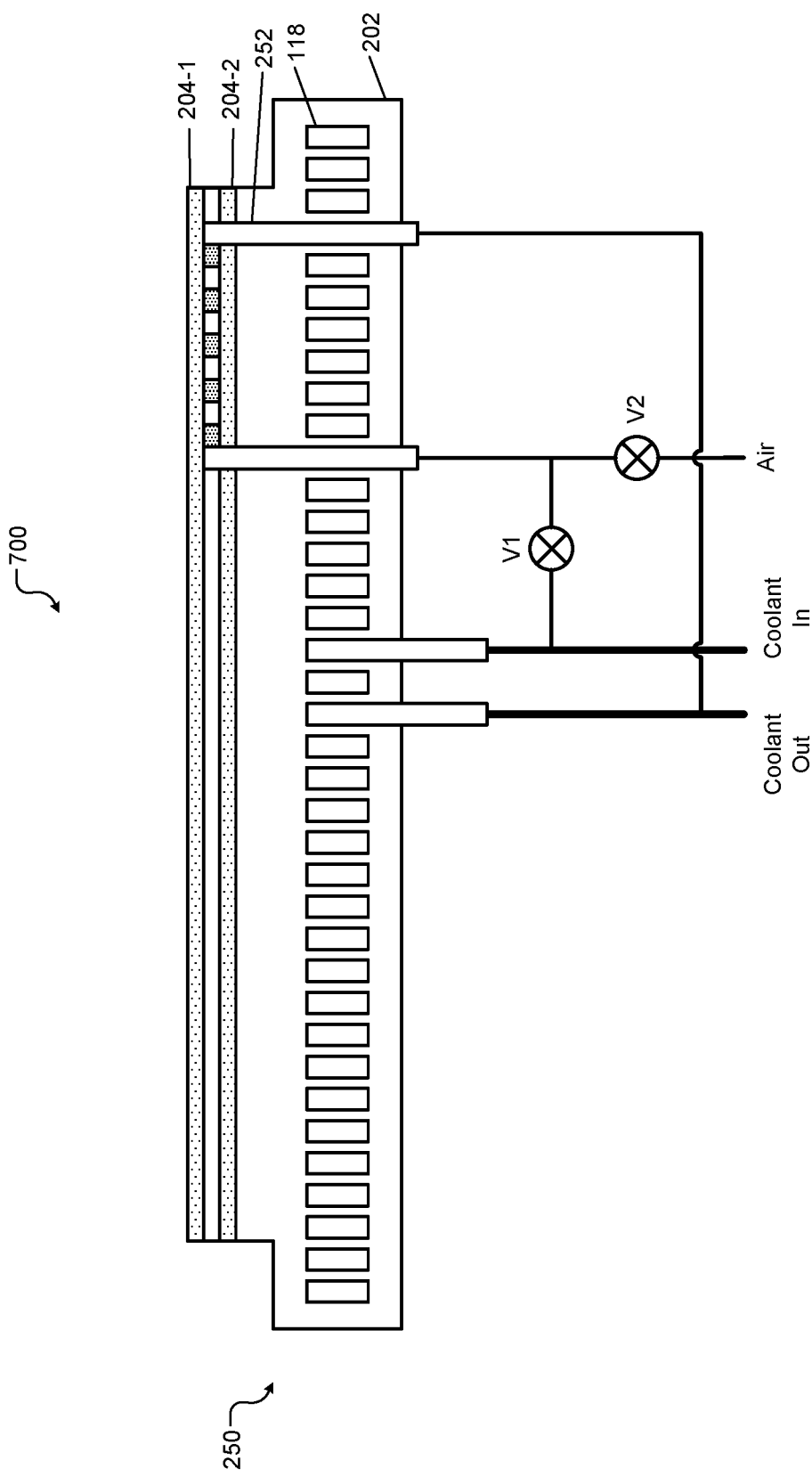
FIGS. 7-10 show various examples of apparatuses for filling and emptying the micro-channels.

FIG. 7 shows a first example of an apparatus 700 for filling and emptying the micro-channels 252. In the first example, the coolant from the coolant assembly 154 shown in FIG. 1B, which is normally supplied to the cooling channels 118 in the baseplate 202 of the ESC 250, is also supplied to the micro-channels 252. Valves V1 and V2 are used to fill and empty the micro-channels 252. Valves V1 and V2 are controlled by the controller 54 shown in FIG. 1A or the system controller 160 shown in FIG. 1B as follows. Hereinafter, all references to the system controller 160 should be understood as also referencing the controller 54.

To fill the micro-channels 252 with the coolant, valve V2 is closed, and valve V1 is opened. Valve V1 allows some of the coolant flowing into the cooling channels 118 to also flow into the micro-channels 252. After the micro-channels 252 are filled, a desired processing step is performed on the wafer 208 with the micro-channels 252 filled. Subsequently, to empty the micro-channels 252, valve V1 is closed, and valve V2 is opened. Air flows through valve V2 and displaces the coolant from the micro-channels 252.

Figure 8:
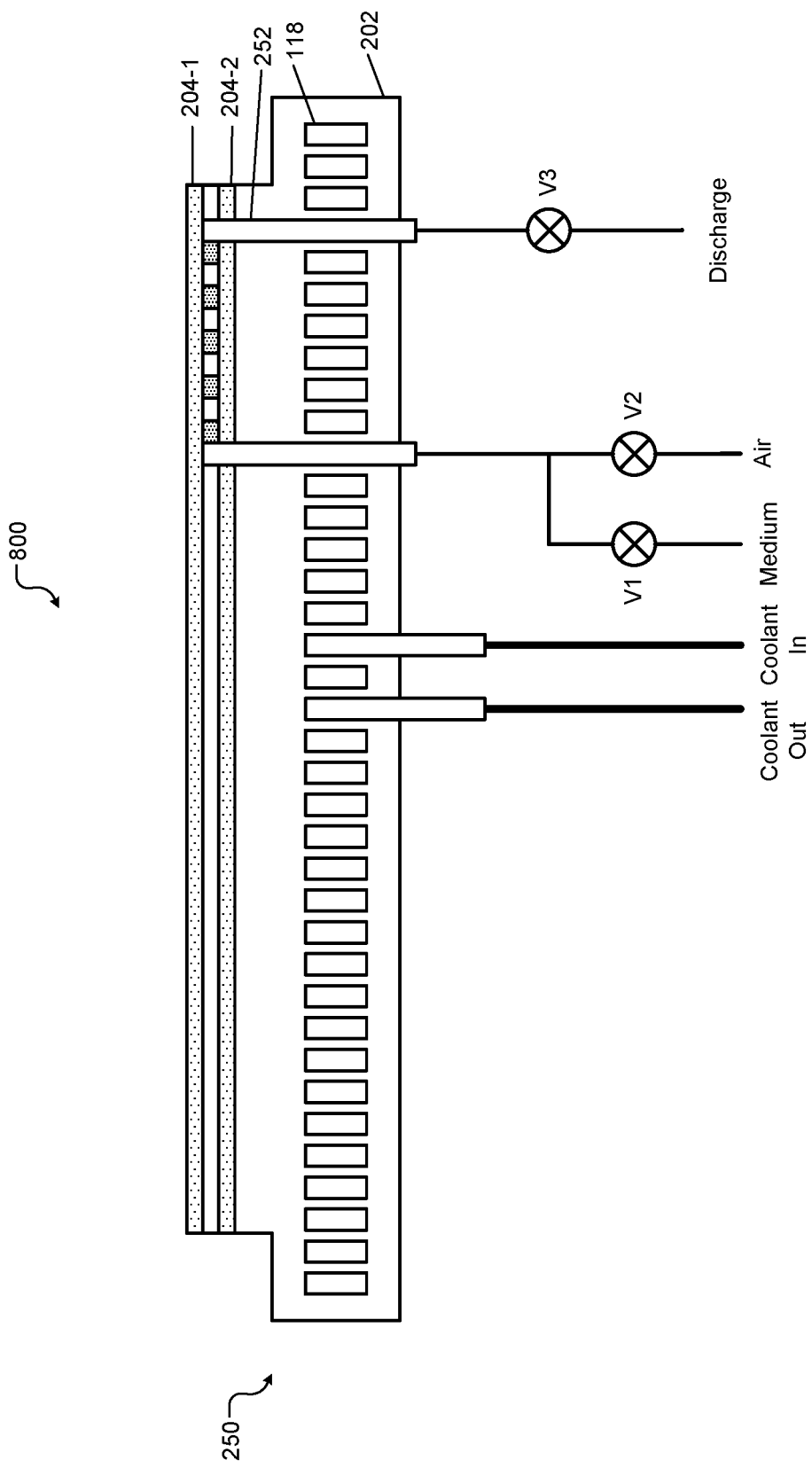

FIG. 8 shows a second example of an apparatus 800 for filling and emptying the micro-channels 252. In the second example, the micro-channels 252 are supplied with an alternate medium instead of the coolant supplied to the cooling channels 118. The medium is supplied by a source (not shown) that is separate from the coolant assembly 154 and that is external to the ESC 250. Valves V1 and V2 are used to fill and empty the micro-channels 252. Valves V1 and V2 are controlled by the system controller 160 (shown in FIG. 1) as follows.

To fill the micro-channels 252 with the medium, valve V2 is closed, and valve V1 is opened. Valve V1 allows the medium from the source to flow into the micro-channels 252. After the micro-channels 252 are filled, a desired processing step is performed on the wafer 208 with the micro-channels 252 filled. Subsequently, to empty the micro-channels 252, valve V1 is closed, and valve V2 is opened. Air flows through valve V2 and displaces the coolant from the micro-channels 252. Valve V3 is optional and is used to control discharge of the medium through a discharge line connected to valve V3 (e.g., for waste collection).

Figure 9:
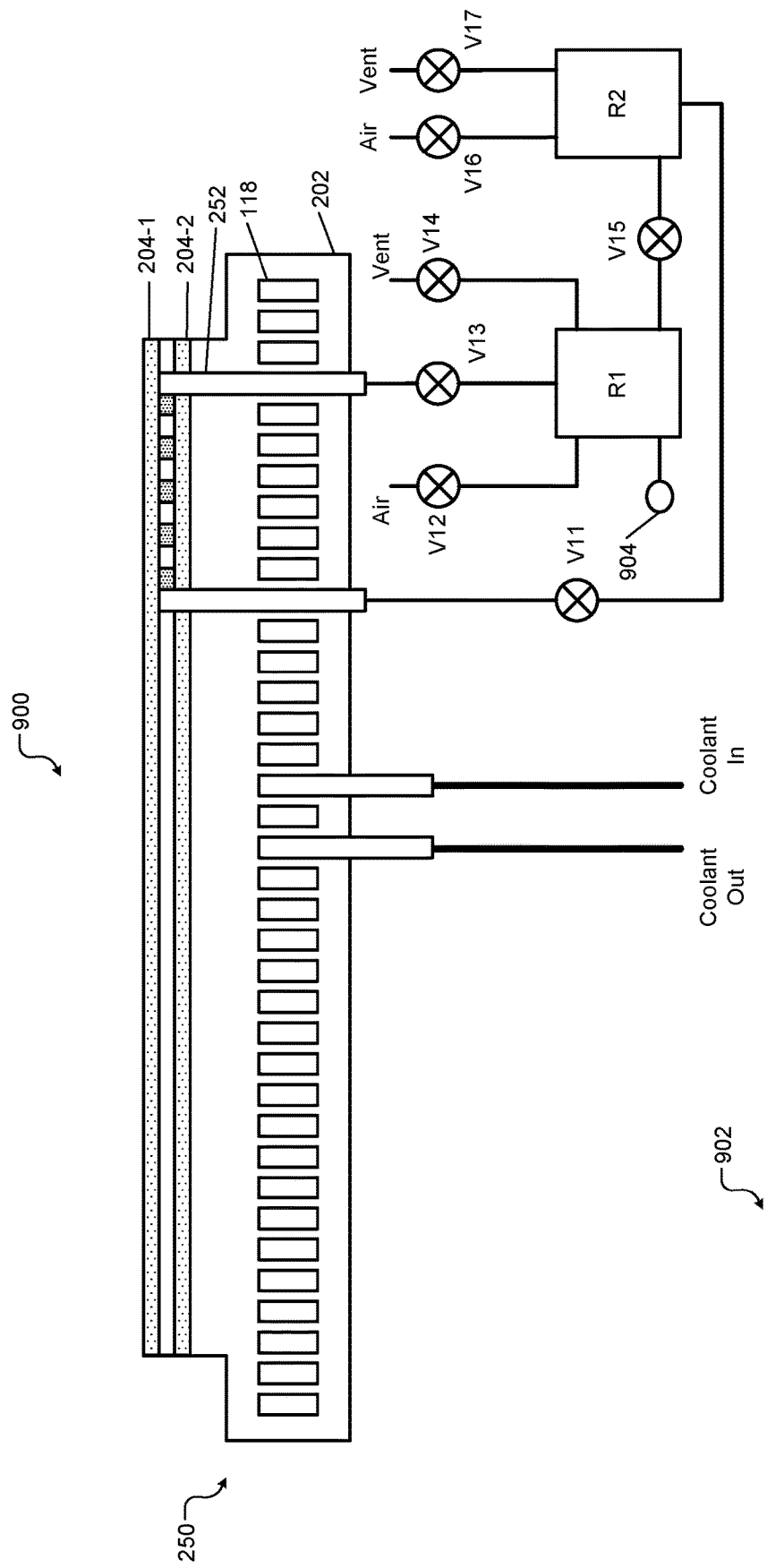

FIG. 9 shows a third example of an apparatus 900 for filling and emptying the micro-channels 252. In the third example, the micro-channels 252 are supplied with an alternate medium instead of the coolant supplied to the cooling channels 118. The medium is supplied by a source that is separate from the coolant assembly 154 and that is external to the ESC 250. Specifically, the apparatus 900 employs a closed system including two reservoirs R1 and R2 and valves V11 to V17. The apparatus 900 uses air pressure to transfer the medium from reservoir R2 to the micro-channels 252, to reservoir R1, and back to reservoir R2. That is, the apparatus 900 uses air pressure to fill and empty the micro-channels 252. Valves V11 to V17 are controlled by the system controller 160 (shown in FIG. 1) as shown in a truth table 902.

Specifically, as shown in the truth table 902, to fill the micro-channels 252 with the medium from reservoir R2, valves V12, V15, and V17 are closed (shown as X in the truth table 702); and valves V11, V13, V14, and V16 are opened (shown as O in the truth table 702). A level sensor 704 associated with reservoir R1 indicates to the system controller 160 when the filling operation is complete. Then, with the micro-channels 252 filled with the medium, valves V11 to V17 are closed during wafer processing. After the micro-channels 252 are filled, a desired processing step is performed on the wafer 208 with the micro-channels 252 filled.

Subsequently, to drain the micro-channels 252 into reservoir R1, valves V12, V15, and V17 are closed; and valves V11, V13, V14, and V16 are opened. After valves V11, V13, V14, and V16 are opened, any medium remaining in reservoir R2 is blown out of reservoir R2 into reservoir R1. This step ends when reservoir R2 is empty, which can be detected by a fall in air pressure at valve V16 or by a level sensor, for example. To transfer the medium from reservoir R1 to reservoir R2, valves V11, V13, V14, and V16 are closed; and valves V12, V15, and V17 are opened. The level sensor 904 associated with reservoir R1 indicates to the system controller 160 when the transfer is complete.

Overall, the medium flows from reservoir R2 into the micro-channels 252. Then any medium remaining in reservoir R2 in blown into reservoir R1. Then the medium in reservoir R1 is pushed to reservoir R2 (e.g., in an operation that may be performed in parallel with another process step to save processing time). At this point, the apparatus 900 is reset and ready to fill the micro-channels 252 with the medium from reservoir R2.

Figure 10:
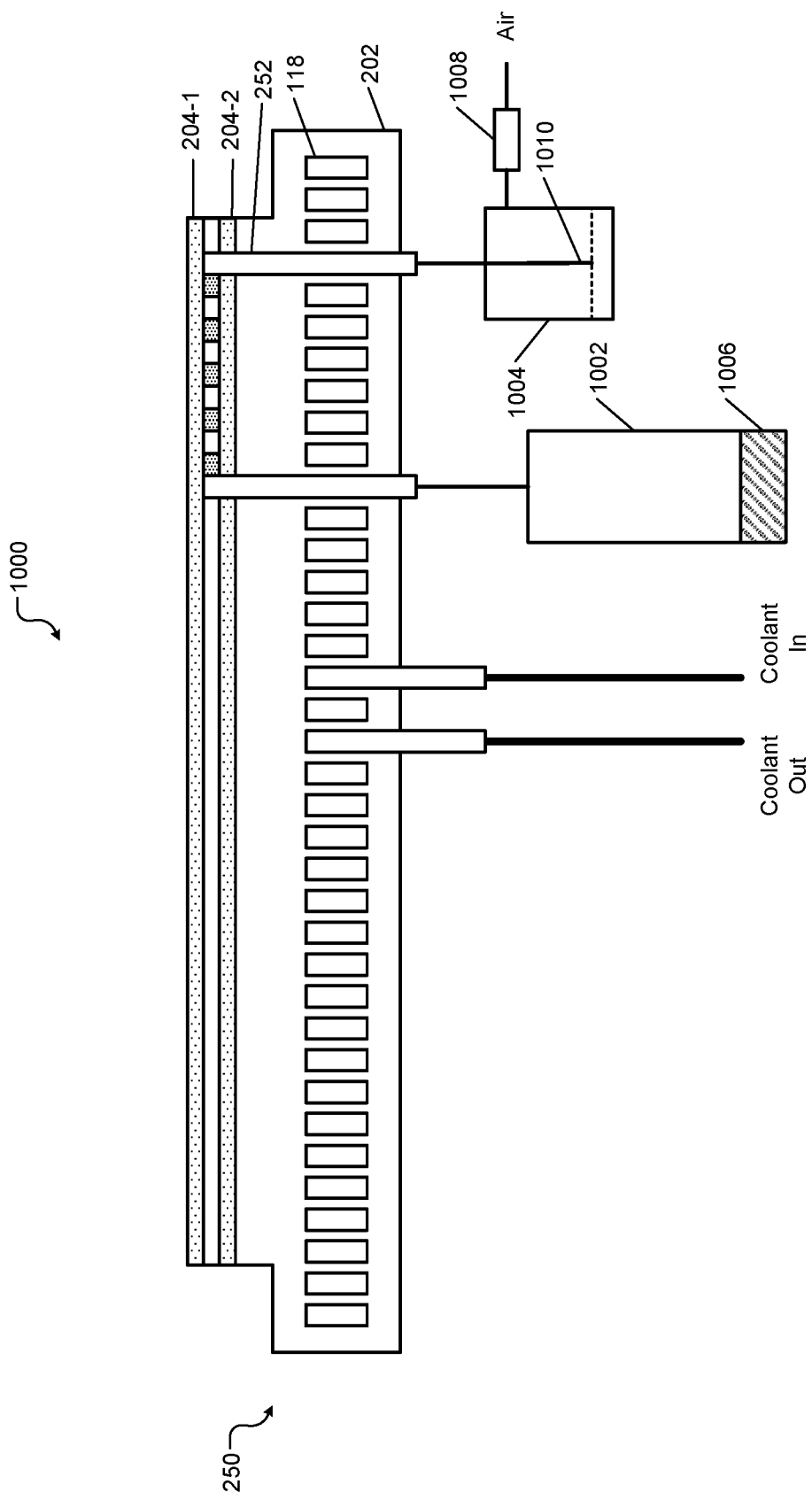

FIG. 10 shows a fourth example of an apparatus 1000 for filling and emptying the micro-channels 252. In the fourth example, the micro-channels 252 are supplied with an alternate medium instead of the coolant supplied to the cooling channels 118. The medium is supplied by a source that is separate from the coolant assembly 154 and that is external to the ESC 250. Specifically, the apparatus 1000 employs a valve-less closed system including two reservoirs 1002, 1004 and a heater 1006 associated with the reservoir 1002. The apparatus 1000 uses thermal expansion to transfer the medium. The system controller 160 (shown in FIG. 1) controls an amount of power supplied to the heater 1006.

Specifically, with the reservoir 1002 cold (e.g., with the heater 1006 turned off or supplied with low power), the medium contracts and is drawn into the reservoir 1002. Air flows into the reservoir 1004 through an air filter 1008 when the medium level in the reservoir 1004 drops below a dip tube 1010, and fills the micro-channels 252. When the heater 1006 heats the reservoir 1002 (e.g., with the heater 1006 turned on or supplied with high power), due to thermal expansion of the medium in reservoir 1002, the medium from the reservoir 1002 fills the micro-channels 252. Any excess fluid drains into the reservoir 1004 (also called overflow reservoir). Air is expelled from the micro-channels 252 into the reservoir 1004 and from the reservoir 1004 to the outside through the filter 1010.

After the micro-channels 252 are filled, a desired processing step is performed on the wafer 208 with the micro-channels 252 filled. Subsequently, to remove the medium from the micro-channels 252, the reservoir 1002 is cooled (e.g., the heater 1006 turned off or supplied with low power). With the reservoir 1002 cold (e.g., with the heater 1006 turned off or supplied with low power), the medium contracts and is drawn from the micro-channels 252 into the reservoir 1002. Air flows into the reservoir 1004 through an air filter 1008 when the medium level in the reservoir 1004 drops below a dip tube 1010, and fills the micro-channels 252, displacing the medium in the micro-channels 252.

Figure 12:
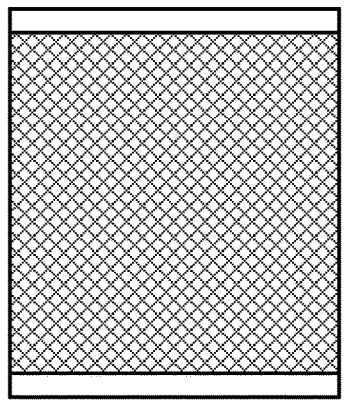
FIGS. 11-15 various configurations and layouts of the micro-channels.
Figure 11:
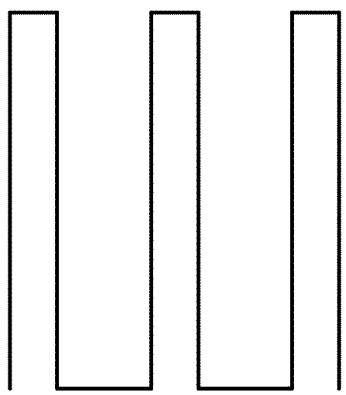

FIGS. 11-15 show different layouts and configurations of the micro-channels 252. For example, FIG. 11 shows that the micro-channels 252 can be serpentine in shape (actual examples shown in FIGS. 13-15). The serpentine channel can be continuous and can extend along a circumference of the ceramic layer 204 as shown at 252 in FIG. 4. In another example, FIG. 12 shows that the micro-channels 252 can be in the form of a broad channel with a porous fill. The broad channel can be continuous and can extend along the circumference of the ceramic layer 204 as shown at 252 in FIG. 4.

Figure 13:
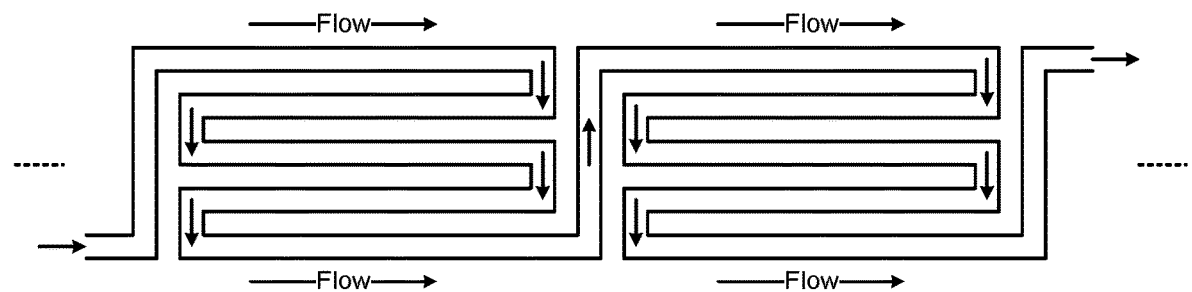

FIG. 13 shows another example of the micro-channels 252 where the micro-channels 252 can be in the form of a continuous channel with serpentine segments connected in series. The continuous channel is annular and extends along the circumference of the ceramic layer 204 as shown at 252 in FIG. 4. The number of twists in the serpentine segments may vary. The direction of fluid flow through the micro-channels 252 is shown by arrows.

Figure 14:
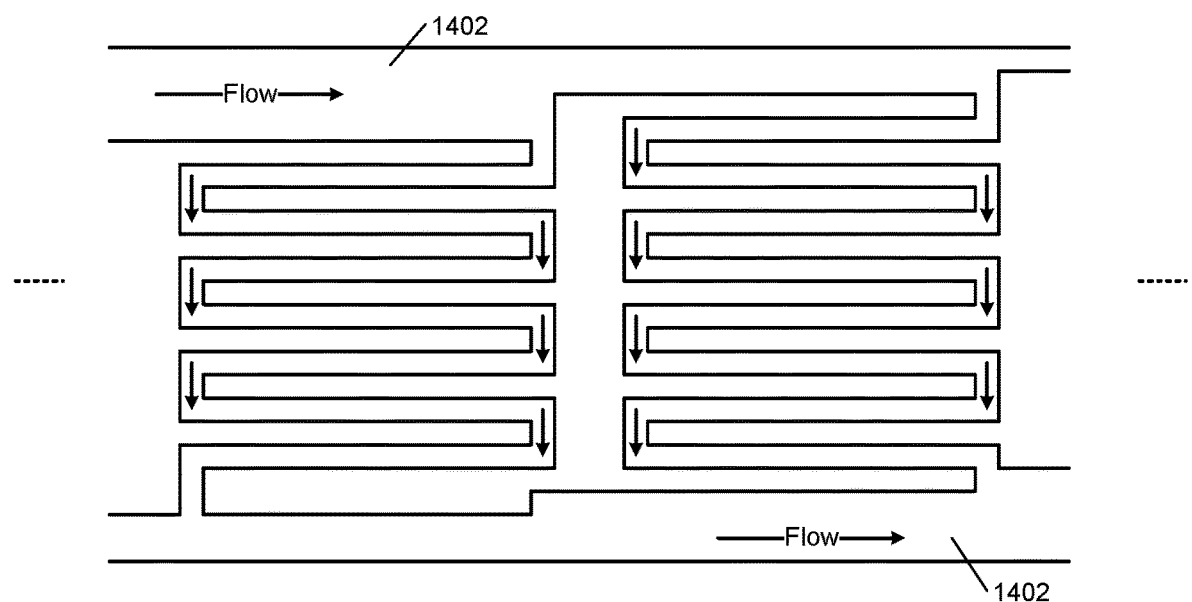

FIG. 14 shows another example of the micro-channels 252 where the micro-channels 252 can be in the form of a continuous channel with serpentine segments connected in parallel within a manifold 1402 in the ceramic layer 204. The continuous channel is annular and extends along the circumference of the ceramic layer 204 as shown at 252 in FIG. 4. Again, the number of twists in the serpentine segments may vary. The direction of fluid flow through the micro-channels 252 is shown by arrows. While not shown, the channel width may be changed to equalize pressure drops between serpentine segments.

Figure 15:
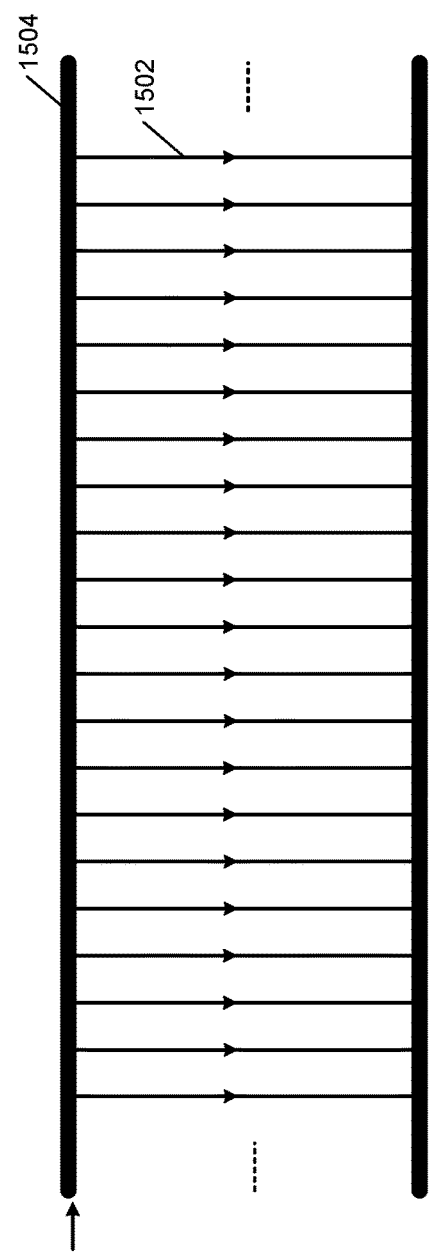

FIG. 15 shows yet another example of the micro-channels 252 where the micro-channels 252 are disposed radially within in the ceramic layer 204. The micro-channels 252 are formed by disposing a plurality of radial groves 1502 between a pair of annular concentric grooves 1504-1, 1504-2 (collectively annular concentric grooves 1504) disposed within the ceramic layer 204 as shown at 252 in FIG. 4. The radial grooves 1502 have smaller dimensions than the annular concentric grooves 1504. The fluid is supplied to the outer annular concentric groove 1504-1. The fluid flows through the plurality of radial groves 1502 radially inward from the circumference towards the center. The fluid flows into the outer annular concentric grooves 1504-2.

Alternatively, the direction of the fluid flow through the plurality of radial groves 1502 can be reversed (i.e., the fluid can flow through the plurality of radial groves 1502 in a radially outward direction away the center). The fluid is supplied to the inner annular concentric groove 1504-2. The fluid flows through the plurality of radial groves 1502 radially outward from the center towards the circumference. The fluid flows into the outer annular concentric grooves 1504-2.

Figure 16:
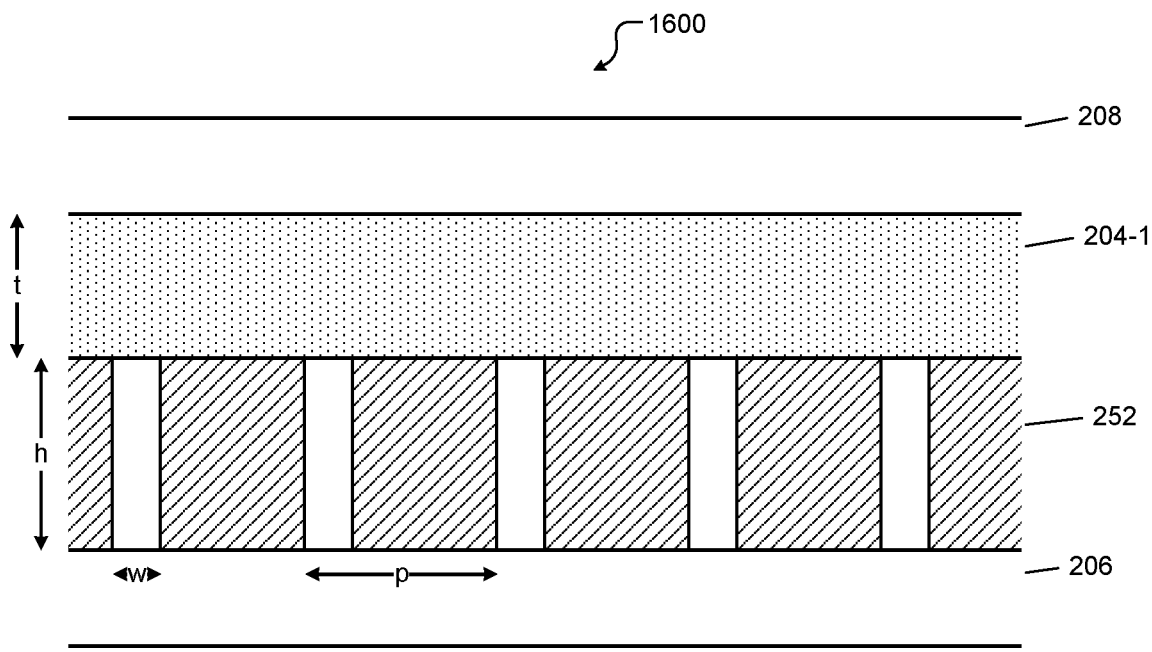
FIGS. 16-19 show various examples of configurations of the ESC comprising the micro-channels.

FIGS. 16-19 show examples of various configurations of the ESC comprising the micro-channels 252. FIG. 16 shows a first configuration of an ESC 1600 where the RF electrode 206 is also a clamping electrode. That is, the RF electrode 206 is powered with RF as well as DC power to clamp the wafer 208. The micro-channels 252 have a pitch p and a height h, and the walls of the micro-channels 252 have a width w. For example only, the pitch p may be about 400 um, the height h may be about 300 um, and the width w may be about 100 um. Other dimensions are possible.

The micro-channels 252 are disposed directly atop the RF electrode 206 that is made of a metal. This structure (i.e., the micro-channels 252 disposed directly atop the RF electrode 206) is capped by a dielectric sheet (element 204-1 shown in FIGS. 3 and 4). For example only, the height or thickness t of the dielectric sheet may be about 200 um. Other dimensions are possible.

Thus, the upper ceramic layer 204-1 is disposed directly above the structure formed by the micro-channels 252 disposed directly atop the RF electrode 206. In other words, the micro-channels 252 are arranged directly above the RF electrode 206 and directly below the upper ceramic layer 204-1 (or between the RF electrode 206 and the upper ceramic layer 204-1).

Figure 17:
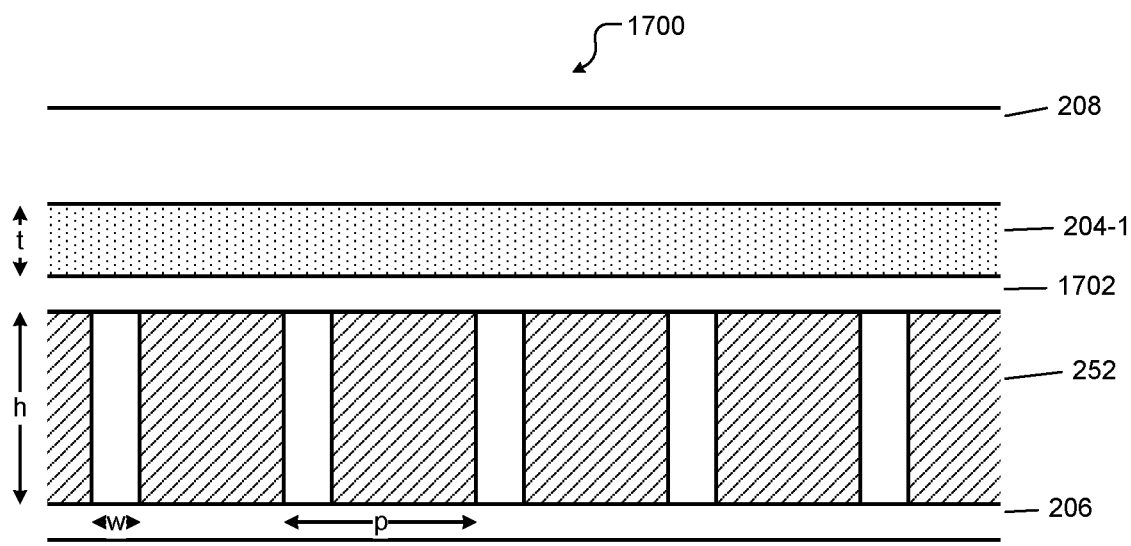

FIG. 17 shows a second configuration of an ESC 1700 where the RF electrode 206 is separate from a clamping electrode 1702. The RF electrode 206 is powered with RF, and the clamping electrode 1702 is powered with DC power. In the example shown, both electrodes are of the same height or thickness (e.g., 25 um). However, the two electrodes 206, 1702 can have different dimensions. Further, the dimensions of the two electrodes, whether same or different, can be other than 25 um.

The micro-channels 252 are disposed between the two electrodes 206, 1702. The micro-channels 252 have a pitch p and a height h, and the walls of the micro-channels 252 have a width w. For example only, the pitch p may be about 500 um; the height h may be about 300 um; and the width w may be about 100 um. Other dimensions are possible. This structure (i.e., the micro-channels 252 disposed directly atop the RF electrode 206 and directly below the clamping electrode 1702) is capped by a dielectric sheet (element 204-1 shown in FIGS. 3 and 4). For example only, the height or thickness t of the dielectric sheet may be about 100 um. Other dimensions are possible.

The upper ceramic layer 204-1 is disposed directly above the structure formed by the micro-channels 252 disposed between the RF electrode 206 and the clamping electrode 1702. That is, the clamping electrode 1702 is arranged directly beneath the upper ceramic layer 204-1; the micro-channels 252 are arranged directly beneath the clamping electrode 1702; the RF electrode 206 is arranged directly beneath the micro-channels 252.

Figure 18:
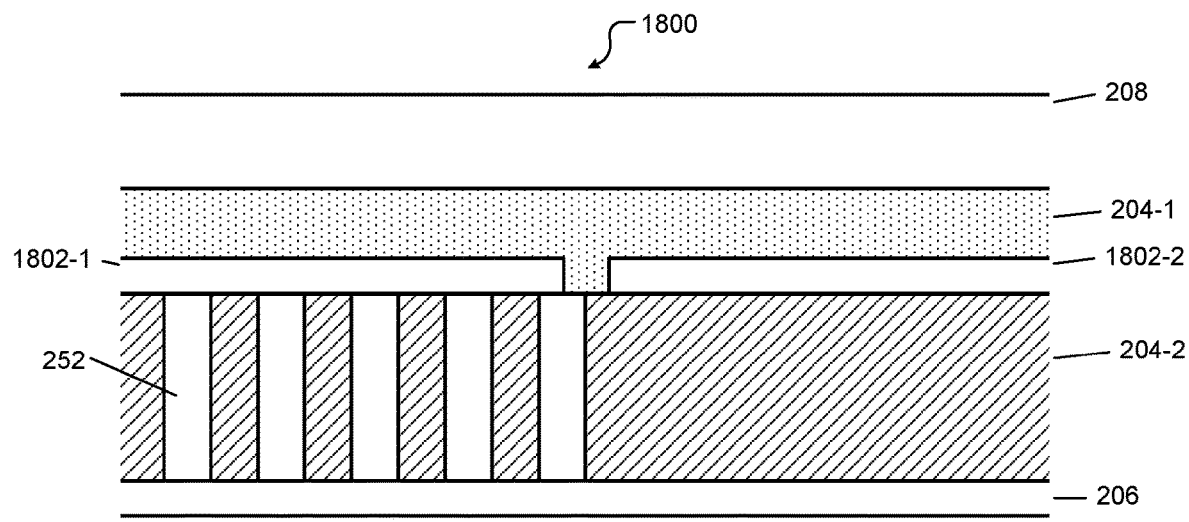

The RF power from the RF electrode 206 effectively passes through the dielectric sheet (element 204-1). However, since the clamping electrode 1702 is at equipotential and so nullifies the spatial modulation of RF current caused by the underlying micro-channels 252, the micro-channels 252 should be capped by a portion of the clamping electrode 1702 that is isolated, from an RF point of view, from a portion of the clamping electrode 1702 that is above a non-channeled part of the ESC surface. FIG. 18 shows such a configuration with a segmented clamping electrode.

FIG. 18 shows a third configuration of an ESC 1800 where the RF electrode 206 is separate from a clamping electrode 1802 and where the clamping electrode 1802 is segmented. The third configuration is identical to the second configuration except that the clamping electrode 1802 segmented as follows. For example, only two segments 1802-1 and 1802-2 of the clamping electrode 1802 are shown. Together, the segments 1802-1 and 1802-2 constitute the outer clamping electrode 1802.

The micro-channels 252 are capped by the portion 1802-1 of the clamping electrode 1802 that is isolated, from an RF point of view, from the portion 1802-2 of the clamping electrode 1802 that is above a non-channeled part of the ESC 1800. The portion 1802-1 of the clamping electrode 1802 is disposed directly above the micro-channels 252 whereas the portion 1802-2 of the clamping electrode 1802 is separated by a dielectric (element 204-2 shown in FIGS. 3 and 4) and does not have the micro-channels 252 under it.

Figure 19:
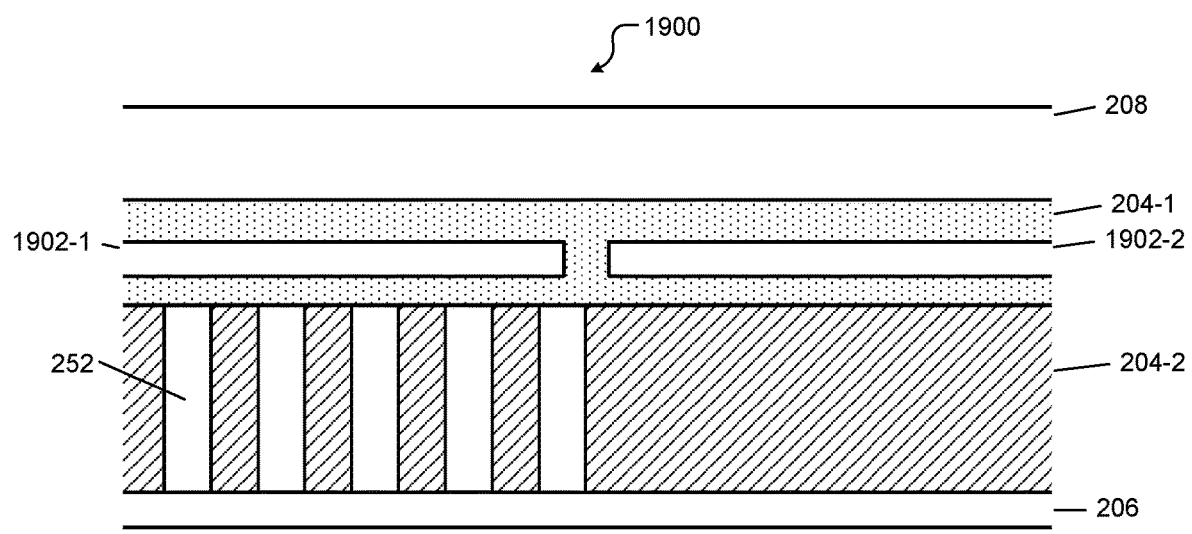

FIG. 19 shows a fourth configuration of an ESC 1900 where the RF electrode 206 is separate from a clamping electrode 1902 and where the clamping electrode 1902 is segmented. The fourth configuration is identical to the third configuration except that a dielectric (a portion of element 204-1) is interposed above the micro-channels 252 and below the clamping electrode 1902 (i.e., between the micro-channels 252 and the clamping electrode 1902). For example, only two segments 1902-1 and 1902-2 of the clamping electrode 1902 are shown. Together, the segments 1902-1 and 1902-2 constitute the outer clamping electrode 1902. The dielectric above the micro-channels 252 (i.e., the portion of element 204-1) provides the benefit that a liquid metal or other conducting liquid can be used to fill the micro-channels 252.

Figure 20:
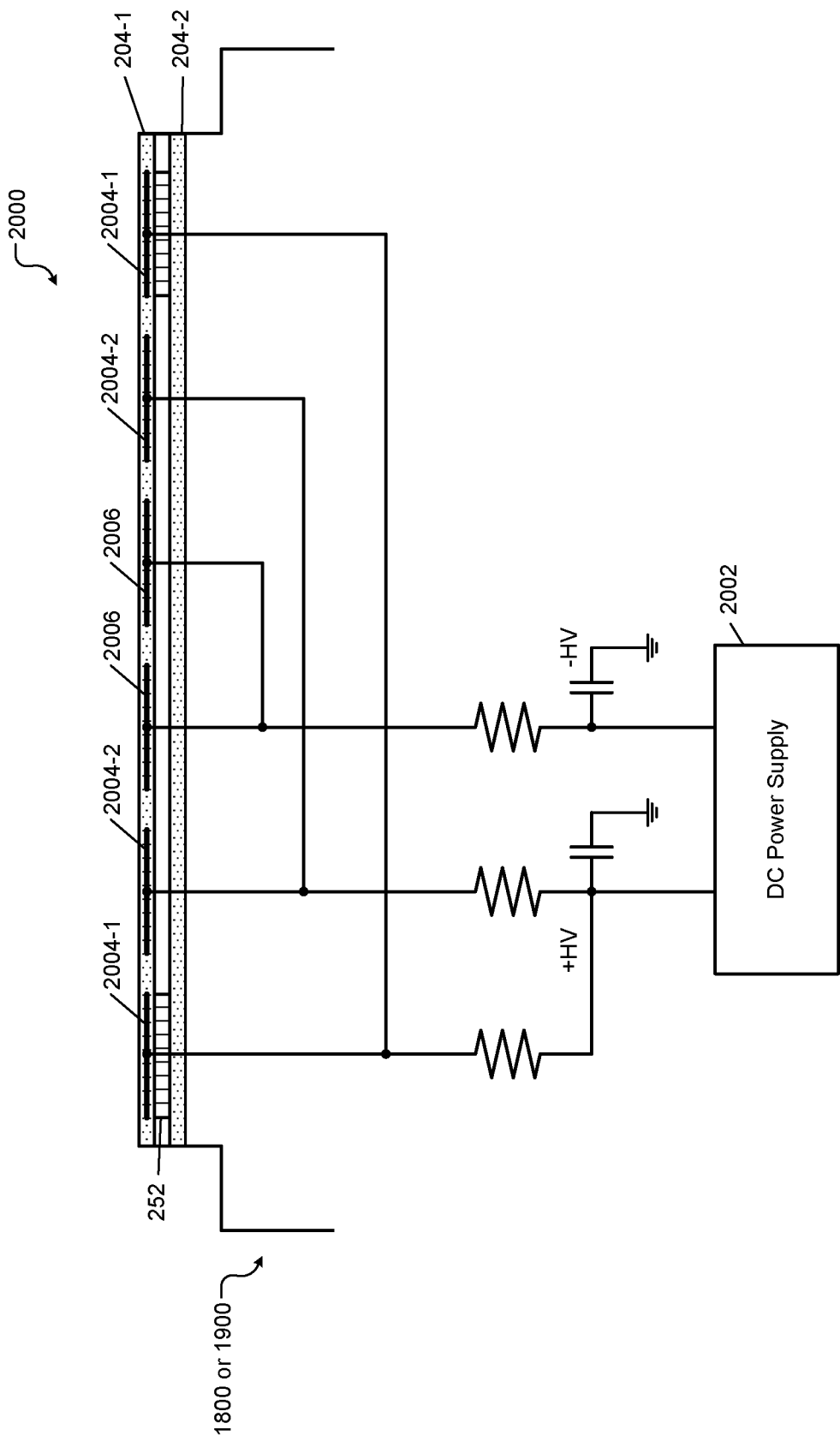
FIG. 20 shows a system for supplying power to a clamping electrode of the ESC comprising the micro-channels.

FIG. 20 shows a schematic of how the segmented clamping electrode (elements 1802, 1902) can be powered from a clamping (DC) power supply. A system 1800 comprises a DC power supply 2002 that supplies DC power to a segmented clamping electrode (e.g., element 1802 or 1902) of an ESC comprising the micro-channels 252 (e.g., ESC 1800 or 1900). The clamping electrode comprises an outer clamping electrode 2004 and an inner clamping electrode 2006.

The outer clamping electrode 2004 is separated into a segment 2004-1 overlying the micro-channels 252 and a segment 2004-2 not overlying the micro-channels 252. The segment 2004-1 is similar to the segments 1802-1, 1902-1 shown in FIGS. 18 and 19. The segment 2004-2 is similar to the segments 1802-2, 1902-2 shown in FIGS. 18 and 19. Together, the segments 2004-1 and 2004-2 constitute the outer clamping electrode 2004.

The inner clamping electrode 2006 is not segmented and does not have any of the micro-channels 252 in its proximity, neighborhood, or under it. The two outer segments 2004-1 and 2004-2 of the outer clamping electrode 2004 are fed through separate (respective) filter resistors which separate the inner from the outer zones of the clamping electrode from an RF standpoint while allowing a micro-amp level DC current for clamping.

In the various embodiments described herein, when a separate clamping electrode is used, there are no intervening components such as heating elements between a top surface of the ceramic layer (on which a wafer directly rests) and the clamping electrode, between the clamping electrode and the micro-channels, between the micro-channels and the RF electrode, and between the RF electrode and a bottom surface of the ceramic layer (that directly rests on the baseplate). When a separate clamping electrode is not used, there are no intervening components such as heating elements between the top surface of the ceramic layer and the micro-channels, between the micro-channels and the RF electrode, and between the RF electrode and the bottom surface of the ceramic layer. Thus, the ceramic layer includes only the clamping electrode when used, the micro-channels, and the RF electrode. A wafer is arranged directly on the top surface of the ceramic layer. The bottom surface of the ceramic layer is arranged directly on top of the metal baseplate.

Throughout the present disclosure, fluids can include liquids and/or gases. In addition, when a fluid is drained from the micro-channels, unless another fluid is used to replace the drained fluid, air replaces the drained fluid. In some implementations, vacuum may replace the drained fluid. In general, any fluid that has a higher dielectric constant than air and that has better thermal conductivity than air can be used to fill the micro-channels.

Further, throughout the present disclosure, the terms filling and draining the micro-channels denote fully filling and fully draining the micro-channels, partially filling and fully draining the micro-channels, fully filling and partially draining the micro-channels, or partially filling and partially draining the micro-channels. In general, the micro-channels can be filled so that the level of the fluid increases to a first level and can be drained so that the level of the fluid decreases to a second level that is less than the first level. The first level can denote completely filled or partially filled micro-channels. The second level can denote completely drained or partially drained micro-channels. In other words, the level or amount of the fluid in the micro-channels is varied or altered, using different apparatuses and using different configurations and layouts of the micro-channels described above, to change the permittivity of the material between the RF electrode and the wafer.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support assembly to support a semiconductor substrate in a processing chamber, the substrate support assembly comprising:
   a baseplate arranged in the processing chamber;
   a dielectric layer arranged on the baseplate to support the semiconductor substrate;
   an electrode disposed in the dielectric layer along a horizontal plane;
   a first plurality of interconnected channels having an inlet and an outlet that is separate from the inlet to carry a liquid, wherein the first plurality of channels are disposed in the dielectric layer along the horizontal plane on a side of the electrode facing away from the baseplate; and
   a controller programmed to control liquid level in the first plurality of channels to vary permittivity of material between the electrode and the semiconductor substrate and to adjust amount of power delivered from the electrode to the semiconductor substrate.

2. A system comprising:
the substrate support assembly of claim 1;
a power supply to supply power to the electrode during processing of the semiconductor substrate in the processing chamber; and
a source to supply the liquid to fill the first plurality of channels prior to processing the semiconductor substrate.

3. A system comprising:
the substrate support assembly of claim 1;
a plurality of cooling channels disposed in the baseplate;
a power supply to supply power to the electrode during processing of the semiconductor substrate in the processing chamber;
a source of a coolant to supply the coolant to the cooling channels during the processing of the semiconductor substrate;
a plurality of valves in fluid communication with the source, the cooling channels, and the first plurality of channels; and
a controller programmed to control the plurality of valves to:
supply the coolant from the source to the cooling channels; and
supply the coolant as the liquid to fill the first plurality of channels to a first level prior to performing a first process on the semiconductor substrate.

4. The system of claim 3 wherein the controller is further programmed to drain the coolant from the first plurality of channels to a second level after performing the first process and prior to performing a second process on the semiconductor substrate.

5. The system of claim 4 wherein the first level indicates that the first plurality of channels is completely filled with the coolant and wherein the second level indicates that the first plurality of channels is completely empty.

6. A system comprising:
the substrate support assembly of claim 1;
a power supply to supply power to the electrode during processing of the semiconductor substrate in the processing chamber;
a source to supply the liquid;
a plurality of valves in fluid communication with the source and the first plurality of channels; and
a controller programmed to control the plurality of valves to fill the first plurality of channels with the liquid to a first level prior to performing a first process on the semiconductor substrate.

7. The system of claim 6 wherein the controller is further programmed to drain the liquid from the first plurality of channels to a second level after performing the first process and prior to performing a second process on the semiconductor substrate.

8. The system of claim 7 wherein the first level indicates that the first plurality of channels is completely filled with the liquid and wherein the second level indicates that the first plurality of channels is completely empty.

9. A system comprising:
the substrate support assembly of claim 1;
a power supply to supply power to the electrode during processing of the semiconductor substrate in the processing chamber;
a source to supply the liquid;
a heater associated with the source; and
a controller programmed to supply power to the heater to fill the first plurality of channels with the liquid to a first level prior to performing a first process on the semiconductor substrate.

10. The system of claim 9 wherein the controller is further programmed to alter the power supplied to the heater to withdraw the liquid from the first plurality of channels to a second level after performing the first process and prior to performing a second process on the semiconductor substrate.

11. The system of claim 10 wherein the first level indicates that the first plurality of channels is completely filled with the liquid and wherein the second level indicates that the first plurality of channels is completely empty.

12. A system comprising:
the substrate support assembly of claim 1;
a power supply to supply power to the electrode during processing of the semiconductor substrate in the processing chamber;
a first source of the liquid;
a second source of a fluid;
a plurality of valves in fluid communication with the first and second sources and the first plurality of channels; and
a controller programmed to control the plurality of valves to:
fill the first plurality of channels with the liquid to a first level prior to performing a first process on the semiconductor substrate;
drain the liquid from the first plurality of channels after performing the first process; and
fill the first plurality of channels with the fluid to a second level prior to performing a second process on the semiconductor substrate.

13. The system of claim 12 wherein the first level is equal to the second level.

14. The system of claim 12 wherein:
the first level indicates that the first plurality of channels is completely filled with the liquid, and the second level indicates that the first plurality of channels is completely filled with the fluid;
the first level indicates that the first plurality of channels is completely filled with the liquid, and the second level indicates that the first plurality of channels is partially filled with the fluid;
the first level indicates that the first plurality of channels is partially filled with the liquid, and the second level indicates that the first plurality of channels is completely filled with the fluid; or
the first level indicates that the first plurality of channels is partially filled with the liquid, and the second level indicates that the first plurality of channels is partially filled with the fluid.

15. A system comprising:
the substrate support assembly of claim 1;
a second plurality of channels disposed in the dielectric layer along the horizontal plane on the side of the electrode facing away from the baseplate;
a power supply to supply power to the electrode during processing of the semiconductor substrate in the processing chamber;
a first source of the liquid;
a second source of a fluid;
a plurality of valves in fluid communication with the first and second sources, the first plurality of channels, and the second plurality of channels; and a controller programmed to control the plurality of valves to:
   fill the first plurality of channels with the liquid to a first level prior to performing a process on the semiconductor substrate; and
   fill the second plurality of channels with the fluid to a second level prior to performing the process on the semiconductor substrate.

16. The system of claim 15 wherein the first level is equal to the second level.

17. The system of claim 15 wherein:
the first level indicates that the first plurality of channels is completely filled with the liquid, and the second level indicates that the second plurality of channels is completely filled with the fluid;
the first level indicates that the first plurality of channels is completely filled with the liquid, and the second level indicates that the second plurality of channels is partially filled with the fluid;
the first level indicates that the first plurality of channels is partially filled with the liquid, and the second level indicates that the second plurality of channels is completely filled with the fluid; or
the first level indicates that the first plurality of channels is partially filled with the liquid, and the second level indicates that the second plurality of channels is partially filled with the fluid.

18. A system comprising:
the substrate support assembly of claim 1;
a second plurality of channels disposed in the dielectric layer along the horizontal plane on the side of the electrode facing away from the baseplate;
a power supply to supply power to the electrode during processing of the semiconductor substrate in the processing chamber;
a first source of the liquid;
a second source of a fluid;
a plurality of valves in fluid communication with the first and second sources, the first plurality of channels, and the second plurality of channels; and
a controller programmed to control the plurality of valves to:
   fill the first plurality of channels with the liquid to a first level prior to performing a first process on the semiconductor substrate while the second plurality of channels is empty;
   drain the liquid from the first plurality of channels after performing the first process; and
   fill the second plurality of channels with the fluid to a second level prior to performing a second process on the semiconductor substrate.

19. The system of claim 18 wherein the first level is equal to the second level.

20. The system of claim 18 wherein:
the first level indicates that the first plurality of channels is completely filled with the liquid, and the second level indicates that the second plurality of channels is completely filled with the fluid;
the first level indicates that the first plurality of channels is completely filled with the liquid, and the second level indicates that the second plurality of channels is partially filled with the fluid;
the first level indicates that the first plurality of channels is partially filled with the liquid, and the second level indicates that the second plurality of channels is completely filled with the fluid; or
the first level indicates that the first plurality of channels is partially filled with the liquid, and the second level indicates that the second plurality of channels is partially filled with the fluid.

21. The substrate support assembly of claim 1 wherein the first plurality of channels is arranged in an annular region of the dielectric layer.

22. The substrate support assembly of claim 1 further comprising:
a second plurality of channels disposed in the dielectric layer along the horizontal plane on the side of the electrode facing away from the baseplate;
wherein the first plurality of channels is arranged in a first annular region of the dielectric layer;
wherein the second plurality of channels is arranged in a second annular region of the dielectric layer; and
wherein the first and second annular regions respectively have first and second areas.

23. The substrate support assembly of claim 1 wherein the first plurality of channels is arranged in a pie-shaped region of the dielectric layer, the pie-shaped region defined by two radial segments and an arc along a circumference of the dielectric layer.

24. The substrate support assembly of claim 1 further comprising:
a second plurality of channels disposed in the dielectric layer along the horizontal plane on the side of the electrode facing away from the baseplate;
wherein the first plurality of channels is arranged in a first pie-shaped region of the dielectric layer;
wherein the second plurality of channels is arranged in a second pie-shaped region of the dielectric layer;
wherein the first and second pie-shaped regions respectively have first and second areas; and
wherein each of the first and second pie-shaped regions is defined by two radial segments and an arc along a circumference of the dielectric layer.

25. The substrate support assembly of claim 1 wherein the first plurality of channels is serpentine in shape.

26. The substrate support assembly of claim 1 wherein the first plurality of channels is formed by a porous material.

27. The substrate support assembly of claim 1 wherein the first plurality of channels includes a plurality of serpentine portions connected in series.

28. The substrate support assembly of claim 1 wherein the first plurality of channels is arranged in a manifold in the dielectric layer and includes a plurality of serpentine portions connected in parallel in the manifold.

29. The substrate support assembly of claim 1 wherein:
the first plurality of channels is formed by arranging two annular grooves in the dielectric layer and arranging a plurality grooves radially connecting the two annular grooves; and
each groove in the plurality grooves is of a smaller width than the two annular grooves.

30. A system comprising:
the substrate support assembly of claim 1;
a radio frequency power supply to supply radio frequency power to the electrode during processing of the semiconductor substrate in the processing chamber;
a direct current power supply to supply direct current power to the electrode during the processing of the semiconductor substrate; and
a source to supply the liquid to fill the first plurality of channels prior to the processing of the semiconductor substrate.

31. A system comprising:
the substrate support assembly of claim 1;
a second electrode disposed in the dielectric layer along the horizontal plane on a side of the first plurality of channels facing away from the electrode;
a radio frequency power supply to supply radio frequency power to the electrode during processing of the semiconductor substrate in the processing chamber;
a direct current power supply to supply direct current power to the second electrode during the processing of the semiconductor substrate; and
a source to supply the liquid to fill the first plurality of channels prior to the processing of the semiconductor substrate.

32. The system of claim 31 wherein:
the second electrode includes a first annular segment and a second annular segment; and
the first plurality of channels is arranged in an annular region of the dielectric layer beneath the first annular segment.

33. The system of claim 31 wherein:
the second electrode includes a first annular segment and a second annular segment;
the first plurality of channels is arranged in an annular region of the dielectric layer beneath the first annular segment; and
a portion of the dielectric layer separates the second electrode from the first plurality of channels.

34. The system of claim 31 wherein:
the second electrode includes an outer electrode and an inner electrode;
the outer electrode includes a first annular segment and a second annular segment;
the first plurality of channels is arranged in an annular region of the dielectric layer beneath the first annular segment;
a portion of the dielectric layer separates the second electrode from the first plurality of channels; and
the direct current power supply supplies the direct current power to:
the first annular segment via a first resistor;
the second annular segment via a second resistor; and
the inner electrode via a third resistor.

35. The substrate support assembly of claim 1 further comprising a source to supply the liquid wherein the liquid includes a fluorinated liquid, or a liquid metal selected from a group consisting of mercury and an alloy containing Bismuth, Antimony, Gallium, and/or Indium.

36. The substrate support assembly of claim 1 further comprising a controller programmed to vary liquid level in the first plurality of channels to vary permittivity of material between the electrode and the semiconductor substrate.

37. The substrate support assembly of claim 1 wherein the baseplate comprises cooling channels.

38. The substrate support assembly of claim 1 further comprising:
a radio frequency (RF) power supply to supply RF power to the electrode during processing of the semiconductor substrate in the processing chamber;
a source to supply the liquid;
a plurality of valves in fluid communication with the source and the first plurality of channels; and
a controller programmed to control the plurality of valves to vary permittivity of material between the electrode and the semiconductor substrate by varying liquid level in the first plurality of channels.

\* \* \* \* \*